United States Patent [19]
Kajigaya et al.

[11] Patent Number: 5,976,929
[45] Date of Patent: Nov. 2, 1999

[54] METHOD OF MANUFACTURING A SEMICONDUCTOR INTEGRATED CIRCUIT DEVICE HAVING A CAPACITOR

[75] Inventors: Kazuhiko Kajigaya, Iruma; Masayuki Nakamura, Akishima; Toshikazu Tachibana, Tachikawa; Goro Kitsukawa, Hinode-machi, all of Japan

[73] Assignee: Hitachi, Ltd., Tokyo, Japan

[21] Appl. No.: 08/962,878

[22] Filed: Nov. 3, 1997

Related U.S. Application Data

[63] Continuation of application No. 08/759,127, Dec. 2, 1996, abandoned, which is a continuation of application No. 08/297,039, Aug. 29, 1994, Pat. No. 5,604,365.

[30] Foreign Application Priority Data

Aug. 30, 1993 [JP] Japan ................................. 5-214610

[51] Int. Cl.[6] ........................................... H01L 21/8242
[52] U.S. Cl. ............................................. 438/241; 438/253
[58] Field of Search ............................... 438/3, 238–256, 438/381–398

[56] References Cited

U.S. PATENT DOCUMENTS

| | | | |
|---|---|---|---|
| 5,296,399 | 3/1994 | Park | 437/52 |
| 5,374,579 | 12/1994 | Kuroda | 437/52 |
| 5,518,947 | 5/1996 | Noda | 437/52 |

FOREIGN PATENT DOCUMENTS

A-5-29563  2/1993  Japan.

*Primary Examiner*—Jey Tsai
*Attorney, Agent, or Firm*—Antonelli, Terry, Stout & Kraus, LLP

[57] ABSTRACT

A semiconductor integrated circuit device having a DRAM consisting of memory cells, comprises; a first conductive film deposited over the main surface of a semiconductor substrate and used to form a gate electrode of a memory cell selection MISFET; a second conductive film deposited over the first conductive film and used to form bit lines to transfer data of a memory cell to a sense amplifier; a third conductive film deposited over the second conductive film and used to form a storage node of a capacitor; a fourth conductive film deposited over the third conductive film and used to form a plate electrode of the capacitor; and a fifth conductive film deposited over the fourth conductive film and used to form an interconnect, wherein a transistor in a direct peripheral circuit arranged close to a memory array is electrically connected, through a pad layer formed of the third conductive film, to the interconnection of the fifth conductive film deposited over the fourth conductive film, thereby allowing the aspect ratio of the contact hole formed over the pad layer to be reduced.

10 Claims, 33 Drawing Sheets

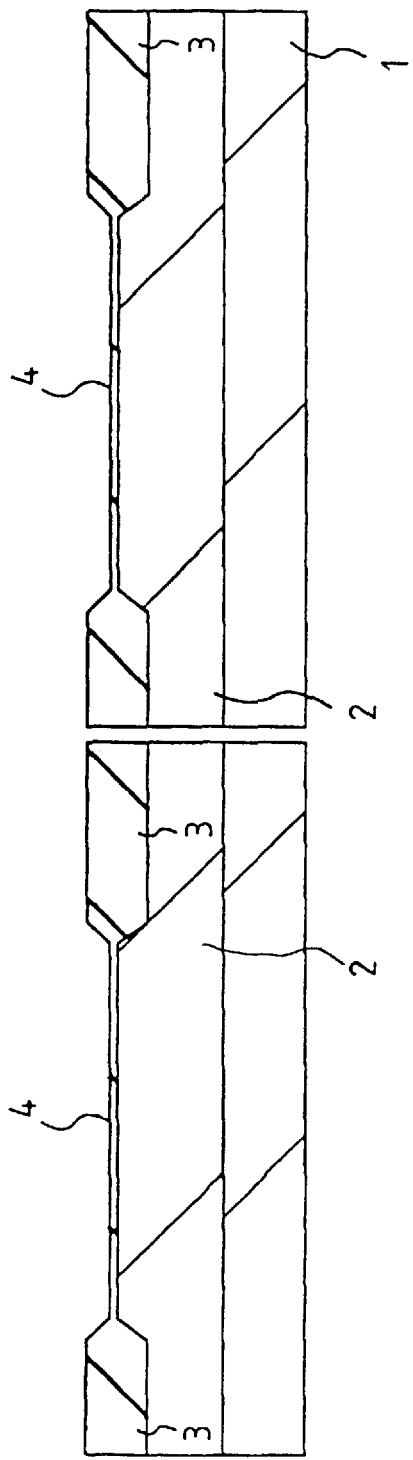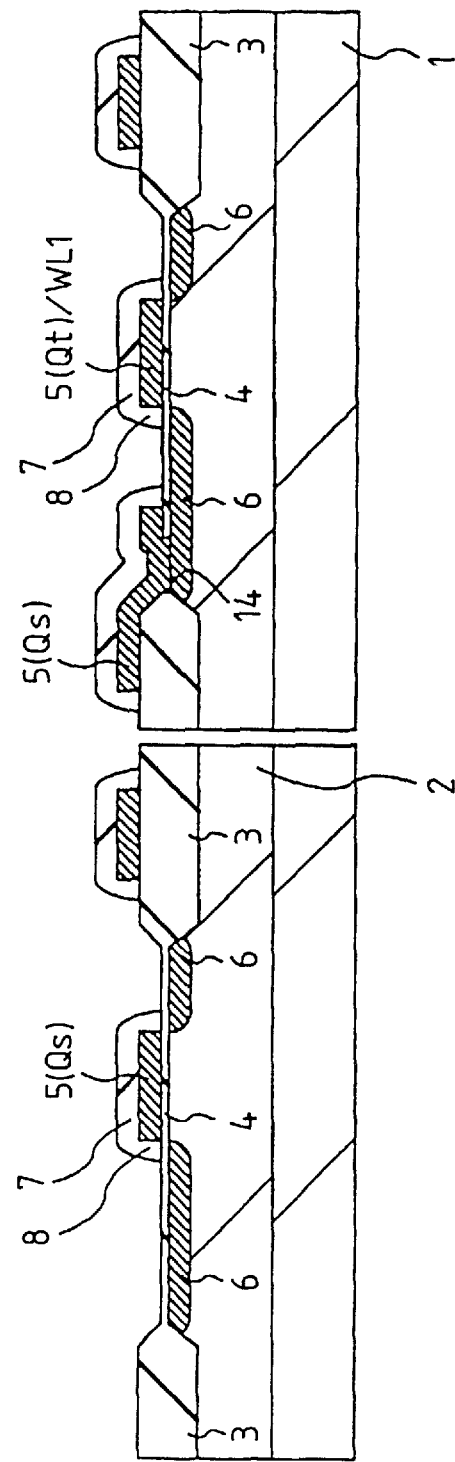

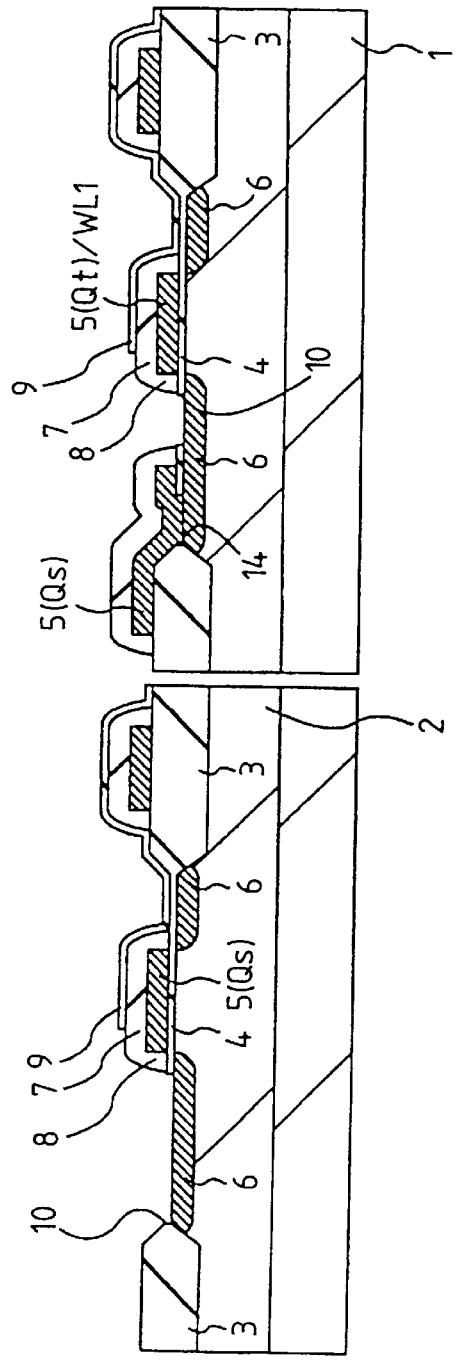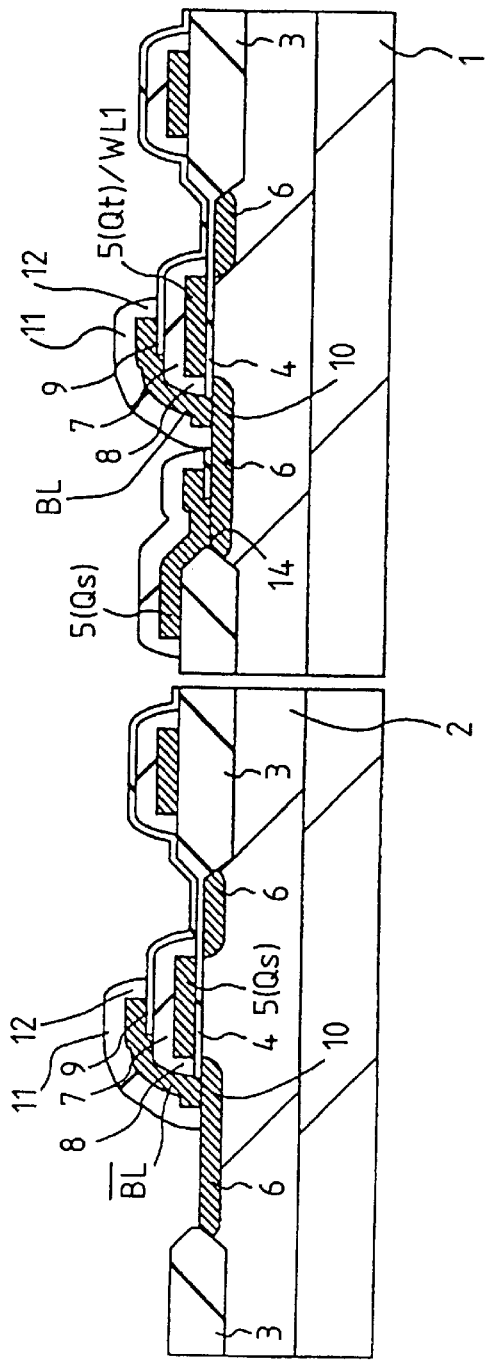

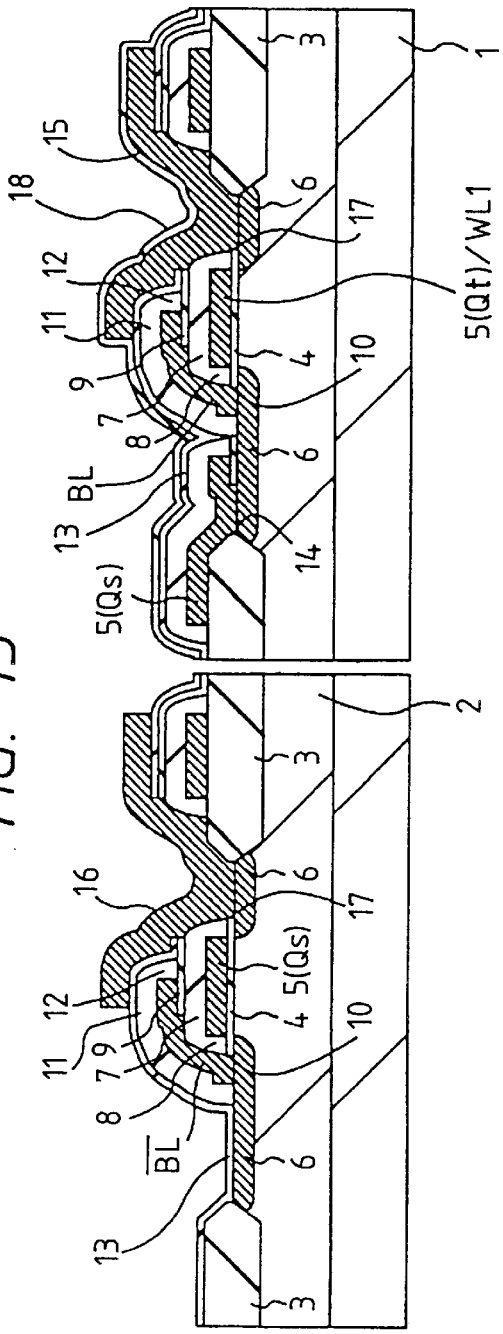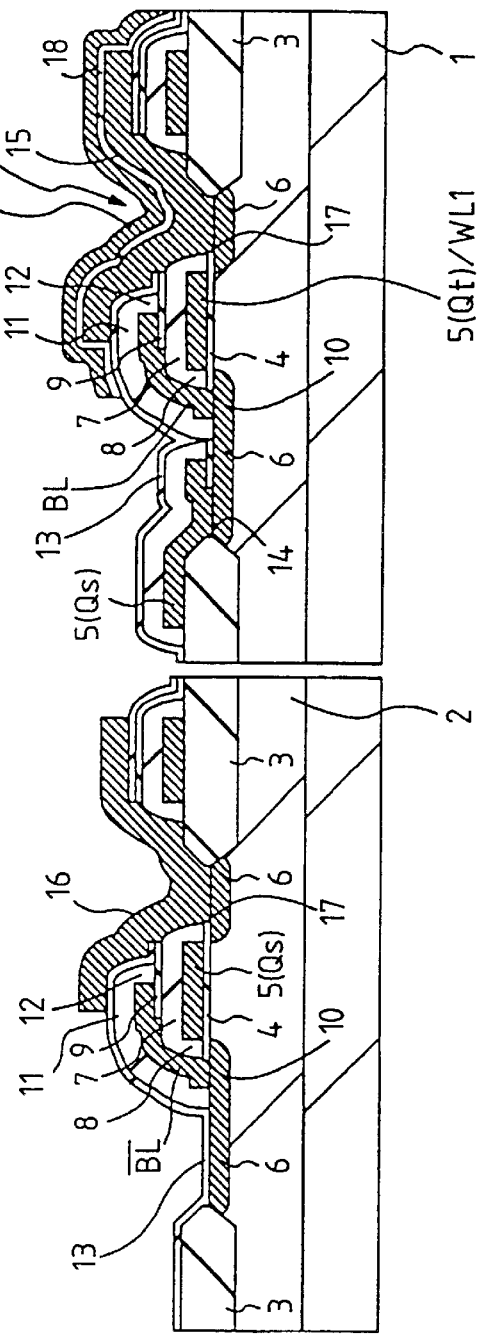

METHOD OF MANUFACTURING A SEMICONDUCTOR INTEGRATED CIRCUIT DEVICE HAVING A CAPACITOR This application is a continuation of application Ser. No. 08/759,127, filed on Dec. 2, 1996; abandoned which is a continuation of application Ser. No. 08/297,039, filed on Aug. 29, 1994, U.S. Pat. No. 5,604,365.

BACKGROUND OF THE INVENTION

The present invention relates to a semiconductor integrated circuit device and a manufacturing method thereof and more specifically to a technique suitably applied to a semiconductor integrated circuit device having DRAMs (dynamic random access memories).

Recently developed large-capacity DRAMs employ a stack structure in which an information storage capacitive device or a capacitor is arranged over a memory cell selection MISFET to make up for reductions in the storage charge of the capacitor caused by miniaturization of memory cells.

Of the stack configuration memory cells, a memory cell of a capacitor-over-bitline (COB) structure in which a capacitor is located over the bit line has the advantages that the process burden in forming capacitors can be minimized because a stepped geometry of an underlying material of the storage node is planarized by the bit line and that a high signal-to-noise (S/N) ratio can be obtained because the bit line is shielded by the capacitor.

The COB structure memory cell may, for example, have a construction in which a first conductive film (polysilicon film or polycide film) deposited over the main surface of the semiconductor substrate is used to form a gate electrode of the memory cell selection MISFET and a first word line; in which a second conductive film (polysilicon film or polycide film) deposited over the first conductive film is used to form a bit line; in which a third conductive film (polysilicon film) deposited over the second conductive film is used to form a storage node of the capacitor; in which a fourth conductive film (polysilicon film) deposited over the third conductive film is used to form a plate electrode of the capacitor; and in which a fifth conductive film (Al alloy film or tungsten film) deposited over the fourth conductive film is used to form interconnects such as a second word line and a common source line. In this case, a BPSG (borophospho silicate glass) film is used as an insulation film between the fourth and fifth conductive films and a planarization processing such as reflow is performed to prevent possible breaks of interconnections formed of the fifth conductive film.

SUMMARY OF THE INVENTION

DRAMs comprise a memory array consisting of a large number of memory cells arranged in matrix and peripheral circuits arranged around the memory array. In the following description, of the DRAM peripheral circuits, a portion arranged close to the memory array (such as sense amplifier, word shunt, subword decoder driver, main word decoder driver, and column decoder driver) is referred to as a direct peripheral circuit for distinction from other peripheral circuit portion or indirect peripheral circuit portion (such as input/output buffer).

A study by this inventor found that an attempt to apply the memory cells of the above-mentioned COB structure to a large-capacity DRAM of 64 to 256 Mbit gives rise to a problem of an increased area occupied by the direct peripheral circuit and therefore an increased semiconductor chip area.

That is, because the COB structure memory cell has a capacitor formed over the bit line, the altitude of the memory array (height from the surface of the semiconductor substrate) is higher than the peripheral circuits. Hence, in a region with such altitude differences, forming interconnections using the fifth conductive film that extend continuously from the memory array region to the direct peripheral circuit region increases the possibility of the interconnections being broken. Hence, it is necessary to alleviate the altitude differences between the memory array and the direct peripheral circuit by using such materials as BPSG for the interlayer insulation film lying under the interconnections and then reflowing it.

However, the use of the planarization technique based on the reflow of the BPSG film increases the thickness of the interlayer insulation film in the direct peripheral circuit area between the high-altitude memory array and the low-altitude indirect peripheral circuit area. As a result, in the direct peripheral circuit area arranged close to the memory array, the aspect ratios of contact holes formed in the interlayer insulation film are larger than those in the indirect peripheral circuit area, deteriorating the processing accuracy of contact holes and the connection reliability of interconnections within the contact holes.

To avoid such troubles, a possible measure may involve providing a step buffer area (a region where no semiconductor devices such as MISFETs are formed) between the memory array and the direct peripheral circuit area to separate the direct peripheral circuit area sufficiently from the memory cell, thereby keeping the aspect ratios of the contact holes in the direct peripheral circuit area almost equal to those of the indirect peripheral circuit area.

Provision of the step buffer area around the memory array, however, increases the effective area occupied by the direct peripheral circuit. Particularly in the case of the large-capacity DRAM in which the memory array is divided into a large number of small blocks for higher processing speed and lower power consumption, the number of direct peripheral circuits such as sense amplifiers increases in proportion to the number of divided blocks, which in turn contributes to a significant increase in the area of the semiconductor chip.

In DRAMs having memory cells of COB structure, it is an object of this invention to provide a technique that can reduce the area occupied by the direct peripheral circuit arranged close to the memory array.

These and other objects and novel features of this invention will become apparent from the following description and accompanying drawings.

Representative aspects of this invention may be briefly sumarized as follows.

According to one aspect of this invention, in a DRAM having memory cells of COB structure in which a first conductive film deposited over the main surface of the semiconductor substrate is used to form gate electrodes of the memory cell selection MISFETs, in which a second conductive film deposited over the first conductive film is used to form bit lines to transfer data of the memory cell to a sense amplifier, in which a third conductive film deposited over the second conductive film is used to form a storage node of a capacitor, and in which a fourth conductive film deposited over the third conductive layer is used to form a plate electrode of a capacitor; transistors in the direct peripheral circuit arranged close to the memory array are electrically connected to interconnections formed of the fifth conductive film deposited over the fourth conductive film through a pad layer formed of the third conductive film.

According to another aspect of this invention, in a DRAM having memory cells of COB structure in which a first conductive film deposited over the main surface of the semiconductor substrate is used to form gate electrodes of the memory cell selection MISFETs, in which a second conductive film deposited over the first conductive film is used to form bit lines to transfer data of the memory cell to a sense amplifier, in which a third conductive film deposited over the second conductive film is used to form a storage node of a capacitor, and in which a fourth conductive film deposited over the third conductive layer is used to form a plate electrode of a capacitor; transistors in the direct peripheral circuit arranged close to the memory array are electrically connected to interconnections formed of the fifth conductive film deposited over the fourth conductive film through a first pad layer formed of the third conductive film and through a second pad layer formed of the fourth conductive film.

With the above-mentioned means, by providing a pad layer between the transistors in the direct peripheral circuit and the interconnections formed of the fifth conductive film, it is possible to make the aspect ratio of the contact holes connecting the interconnections and the pad layer smaller than the aspect ratio when the pad layer is not provided, thus improving the processing accuracy of the contact holes and the connection reliability of interconnections in the contact holes. This obviates the need to provide the step buffer region between the memory cells and the direct peripheral circuit.

Further with the above-mentioned means, it is possible to form the MISFET—which constitutes the direct peripheral circuit—in almost the same shape and dimension as the memory cell selection MISFET of the memory cell. It is also possible to form the pad layer in almost the same shape and dimension as the capacitor storage node of the memory cell.

BRIEF DESCRIPTION OF THE DRAWINGS

FIG. 7 is a cross section of an essential portion of a semiconductor substrate showing the method of manufacturing a DRAM of the first embodiment of this invention;

FIG. 8 is a cross section of an essential portion of a semiconductor substrate showing the method of manufacturing a DRAM of the first embodiment of this invention;

FIG. 9 is a cross section of an essential portion of a semiconductor substrate showing the method of manufacturing a DRAM of the first embodiment of this invention;

FIG. 10 is a cross section of an essential portion of a semiconductor substrate showing the method of manufacturing a DRAM of the first embodiment of this invention;

FIG. 13 is a cross section of an essential portion of a semiconductor substrate showing the method of manufacturing a DRAM of the first embodiment of this invention;

FIG. 14 is a cross section of an essential portion of a semiconductor substrate showing the method of manufacturing a DRAM of the first embodiment of this invention;

DESCRIPTION OF THE PREFERRED EMBODIMENTS

Figure 1:
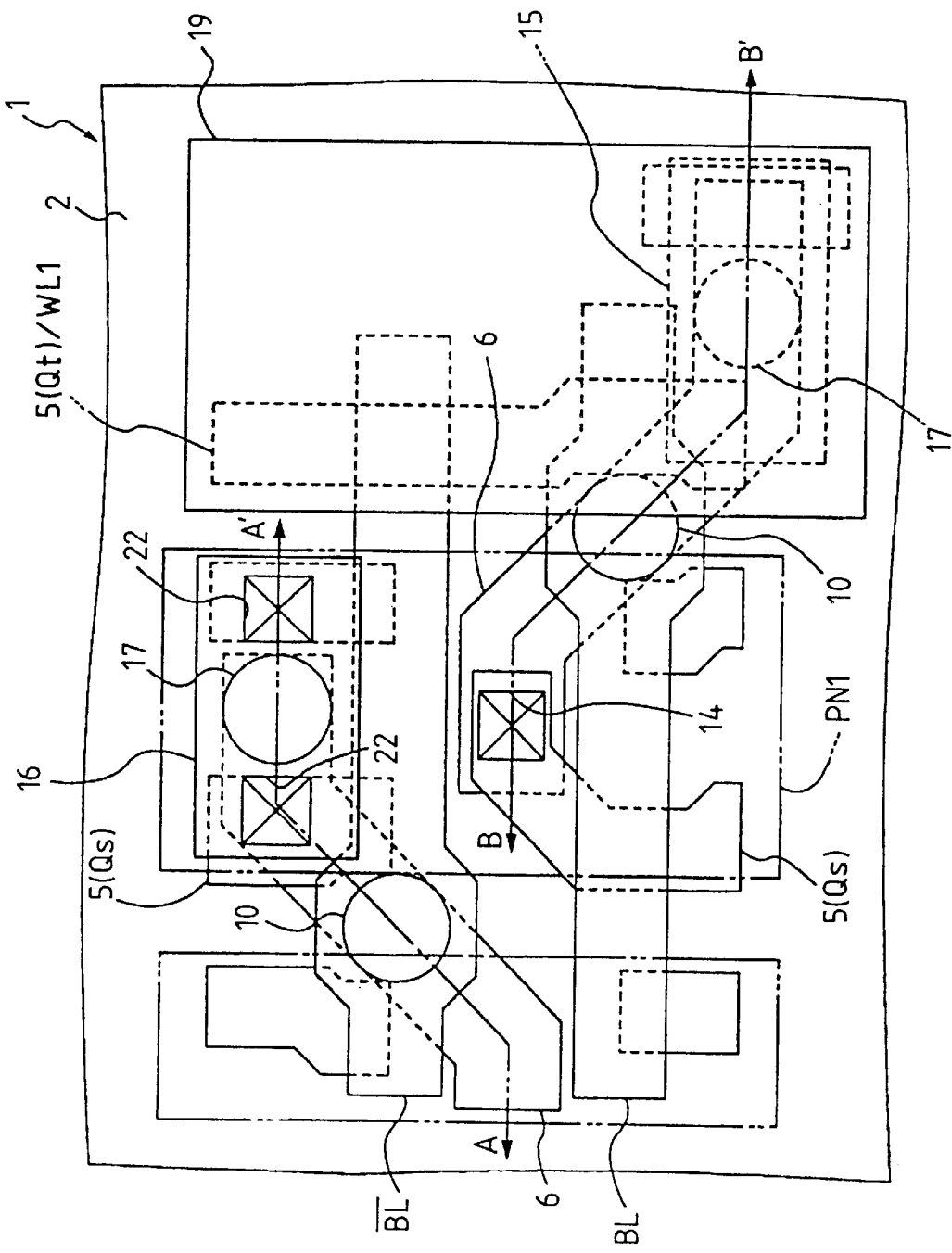
FIG. 1 is a plan view of one embodiment of this invention showing the layout of a part of a DRAM memory cell and of a direct peripheral circuit formed adjacent to the memory cell.

Now, the present invention will be described in detail by taking some embodiments for example. Throughout all the drawings, like reference numerals are assigned to components with the same function and the repetition of explanation on similar components is omitted.

Embodiment 1

Figure 5:
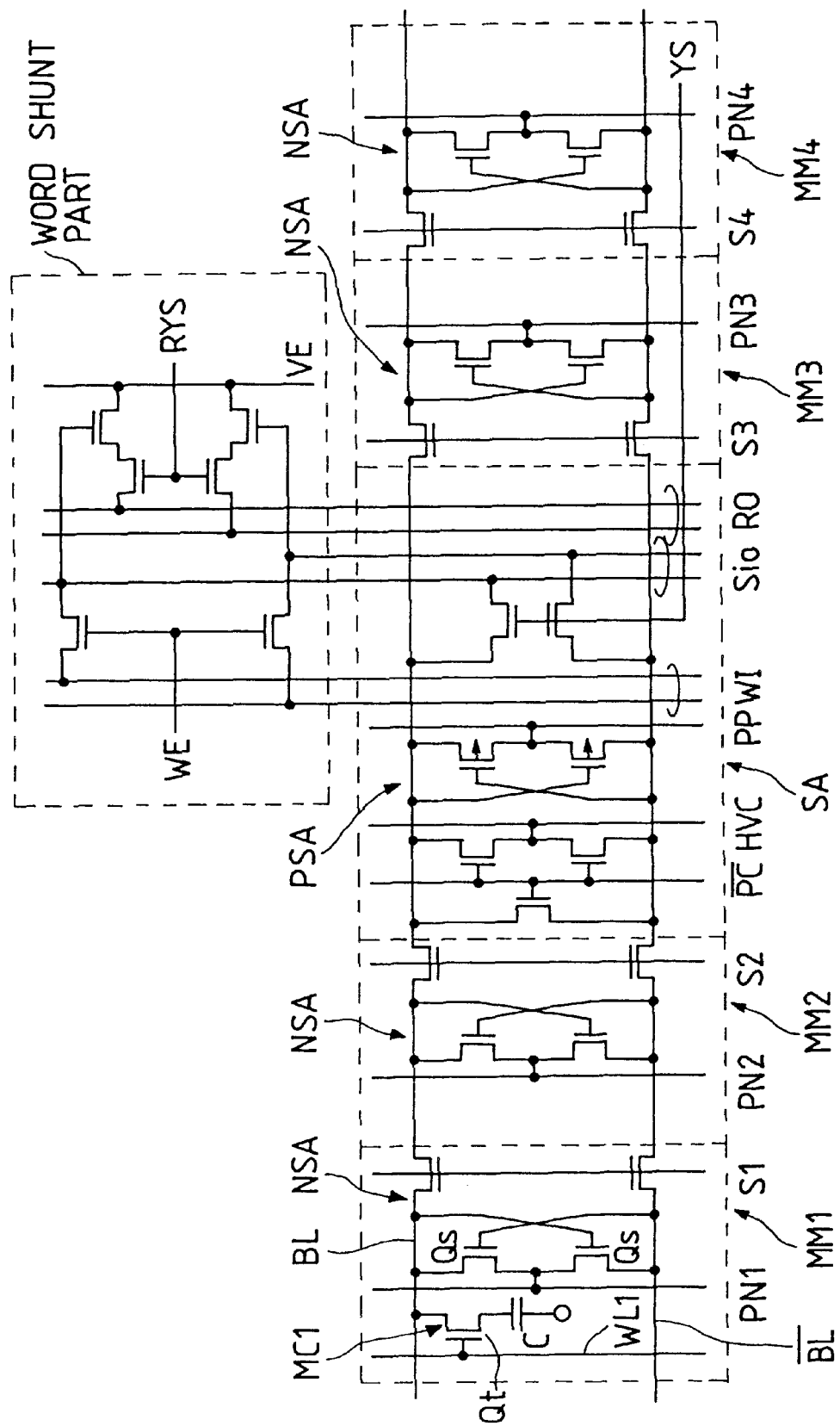
FIG. 5 is a circuit diagram of the first embodiment showing a part of a DRAM memory cell and of a direct peripheral circuit.

FIG. 5 is a circuit diagram of this embodiment showing the DRAM memory array and a part of the direct peripheral circui: (sense amplifier).

As shown in FIG. 5, the DRAM memory array of this embodiment has, for an example, four memory mats MM ($MM_1$–$MM_4$) divided into two groups of two arranged in series, on each side of a sense amplifier SA. Each of the memory mats MM consists of a plurality of pairs of bit lines (BL, $\overline{BL}$), 256 word lines WL (only the first word line $WL_1$ is shown), and a sense amplifier NSA having a latch circuit formed of a pair of n-channel MISFETs Qs. The sense amplifier SA comprises a precharge circuit., a sense amplifier PSA formed of a pair of p-channel. MISFETs, and an I/O switch MISFET.

Each of the word lines WL is connected with a large number of memory cells MC (only a memory cell $MC_1$ is shown). The memory cell MC consists of a memory cell selection n-channel MISFET Qt and a capacitor C storing one bit of information ("1" or "0"). An example of data read from the memory cell $MC_1$ is explained below.

Figure 6:
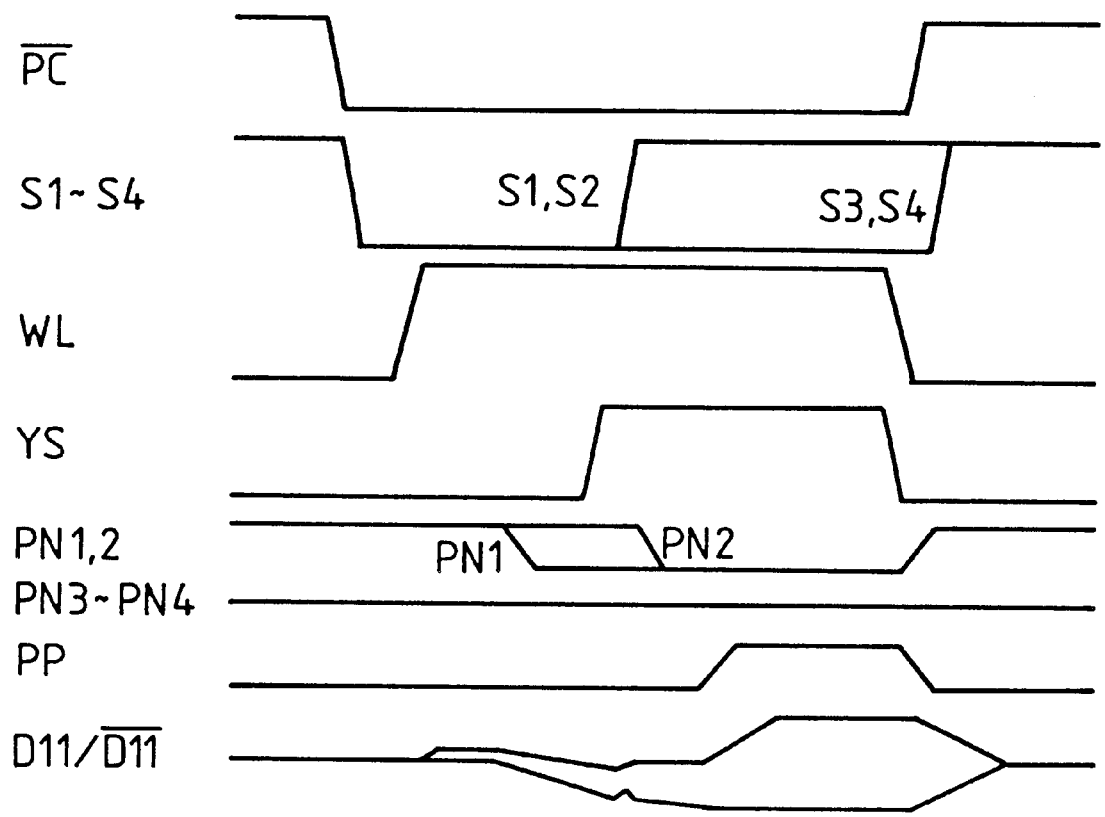
FIG. 6 is a timing chart showing the operation of the circuit of FIG. 5.

As shown in FIG. 5 and 6, during the precharging of bit lines (BL, $\overline{BL}$), $S_1$–$S_4$ are all held high to precharge all the bit lines (BL, $\overline{BL}$) of the four memory mats $MM_1$–$MM_4$ to HVC. During the activation, the $\overline{PC}$ is held low to end the precharging and then $S_1$–$S_4$ are held low to separate the bit lines (BL, $\overline{BL}$) for each memory mat $MM_1$–$MM_4$. After this, a memory cell $MC_1$ of the memory mat $MM_1$ is selected, causing a signal voltage of paired data ($D_{11}$, $\overline{D_{11}}$) to appear on the bit lines (BL, $\overline{BL}$) .

Next, the common source line $PN_1$ is held low to amplify the signal ($D_{11}$, $\overline{D_{11}}$), after which $S_1$ and $S_2$ are held high and the common source line $PN_2$ low. Here, by amplifying the signal sufficiently, it is possible to prevent an erroneous operation even when the bit line capacity increases. Before setting $S_1$ and $S_2$ high, YS is held high so that when $S_2$ is held high, the signal voltage appears on the Sio allowing the signal current to be picked up by a voltage-current amplifier located at the word shunt WC. Then, when PP goes high, the high level of the bit line is restored to the power source potential.

FIG. 1 is a plan view showing the layout of the memory cell $MC_1$ and a part of the sense amplifier (one of the paired n-channel MISFETs Qs) located close to the memory cell. Shown at left in FIG. 2 is a cross section taken along the line A–A' of FIG. 1, and at right a cross section taken along the line B–B'.

Figure 2:
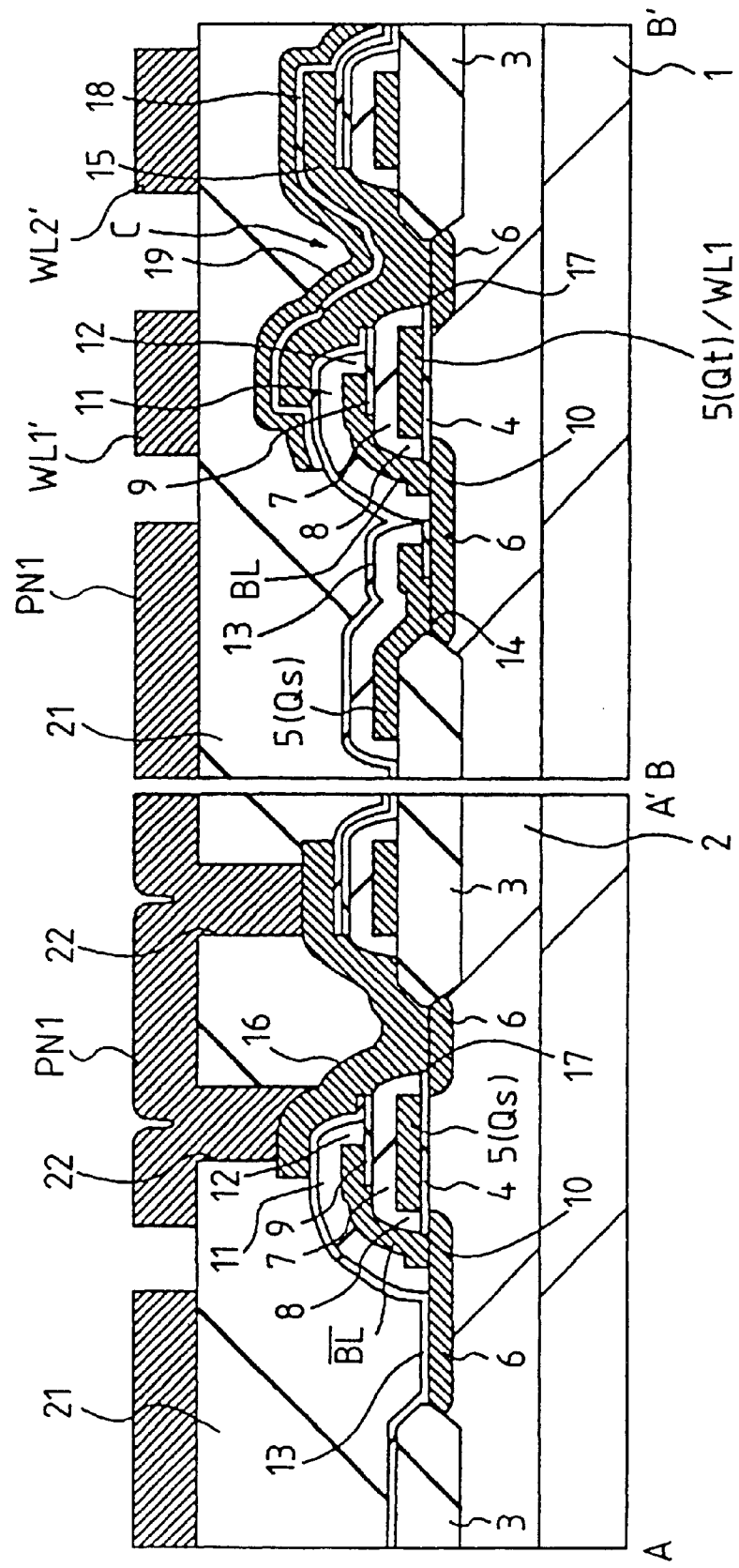
FIG. 2 is cross sections taken along the line A–A' and B–B' of FIG. 1.

As shown in FIG. 1 and 2, the main surface of the semiconductor substrate 1 (semiconductor chip) formed of a p type monocrystal silicon is formed with a p type well 2, the surface of whose non-active region is formed with a field insulation film 3 made of a silicon oxide film. Formed in the main surface of the active region of the p type well 2 enclosed by the field insulation film 3 are the memory cell selection MISFET Qt of the memory cell $MC_1$ and the n-channel MISFET Qs of the sense amplifier NSA.

The memory cell selection MISFET Qt and the n-channel MISFET Qs are each formed of a gate insulation film 4, a gate electrode 5 and a pair of n type semiconductor regions 6 (source region and drain region). The gate electrode 5 of the memory cell selection MISFET Qt is formed integral with the word line $WL_1$. The gate electrode 5 (the first word line $WL_1$ of the first and second word lines described later) is formed of a first conductive film, for example, a polysilicon film. The polysilicon film is doped with an n type impurity (for example P or phosphorus) to reduce its resistance. The gate electrode 5 (i.e. the first word line $WL_1$) may be formed of a polycide film, which consists of refractory metal silicide films such as $WSi_x$, $MoSi_x$, $TiSi_x$ and $TaSi_x$ deposited over the polysilicon film.

Over the gate electrode 5 is formed an insulating film 7, which may be made of a silicon oxide film. The side walls of the gate electrode 5 along the length of the gate are formed with side wall spacers 8, which may be formed of a silicon oxide, for example.

A pair of bit lines (BL, $\overline{BL}$) are deposited over the insulation film 7 and the side wall spacers 8 through an insulation film 9 made of a silicon oxide film. The bit line (BL) is connected to one n type semiconductor region 6 of the memory cell selection MISFET Qt through a contact hole 10 opened in the same insulation layer as the gate insulation film 4. The other bit line ($\overline{BL}$) is connected to one n type semiconductor region 6 of the n-channel MISFET Qs through a contact hole 10 formed in the same insulation layer as the gate insulation film 4.

The bit lines (BL, $\overline{BL}$) are formed of a second conductive film, for example, a polysilicon film, which is doped with an n type impurity (say, P) to reduce resistance. The bit lines (BL, $\overline{BL}$) may be formed of a polycide film, which consists of a refractory metal silicide film deposited over the polysilicon film.

An insulation film 11 is deposited over the bit lines (BL, $\overline{BL}$), whose side wall is formed with a side wall spacer 12. The insulation film 11 and the side wall spacer 12 are formed of, say, a silicon oxide film.

Over the insulation film 11 and the side wall spacer 12 are formed, through an insulation film 13 made of a silicon oxide film, a storage node 15 and a pad layer 16 of the capacitor C. The storage node 15 is connected to the second n type semiconductor region 6 of the memory cell selection MISFET Qt via a contact hole 17 formed in the same insulation layers as the insulation films 13, 9 and the gate insulation film 4. The pad layer 16 is connected to the second n type semiconductor region 6 of the n-channel MISFET Qs via a contact hole 17 formed in the same insulation layers as the insulation films 13, 9 and the gate insulation film 4. The storage node 15 and the pad layer 16 are formed of a third conductive film, for example, a polysilicon film, which is doped with an n type impurity (for example, P) to reduce resistance.

Over the storage node 15 of the capacitor C is deposited, through an insulation film 18, a plate electrode 19 of the capacitor C. The insulation film is formed as a laminated film of a silicon nitride film and a silicon oxide film and constitutes a dielectric film of the capacitor C. The plate electrode 19 is made of a fourth conductive film, for example, a polysilicon film which is doped with an n type impurity (say, P) to reduce resistance. The insulation film 18 and the plate electrode 19 is formed to cover the entire memory cell $MC_1$ but not over the n-channel MISFET Qs.

A common source line $PN_1$ is deposited over the plate electrode 19 through an interlayer insulation film 21. The common source line $PN_1$ is connected to the pad layer 16 through a contact hole 22 formed in the interlayer insulation film 21. That is, the common source line $PN_1$ is connected to the n type semiconductor region 6 of the n-channel MISFET Qs through the pad layer 16.

The common source line $PN_1$ is formed of a fifth conductive film, which may be a three-layer film consisting of a barrier metal film, an aluminum alloy film and a barrier metal film stacked one upon the other. The barrier metal may, for example, be formed of TiW, and the aluminum alloy may be an aluminum added with Cu and Si. The interlayer insulation film 21 may be formed of a silicon oxide film and a BPSG film produced by the CVD method.

Though not shown in FIG. 1, second word lines $WL_1'$, $WL_2'$, . . . are formed of a fifth conductive film over the memory cell MC. The second word lines $WL_1'$, $WL_2'$, . . . extend in the same direction as the first word lines $WL_1$, $WL_2$, . . . and are electrically connected to the first word lines $WL_1$, $WL_2$, . . . at specified regions. Formed over the common source line $PN_1$ and the second word lines $WL_1'$, $WL_2'$, . . . is a final passivation film (not shown) to protect the semiconductor chip 1.

In this way, the DRAM memory cell $MC_1$ of this embodiment has the capacitor C made up of the storage node 15, the plate electrode 19 and the insulation film 18. The capacitor C has a COB structure arranged over the bit line BL.

Figure 3:
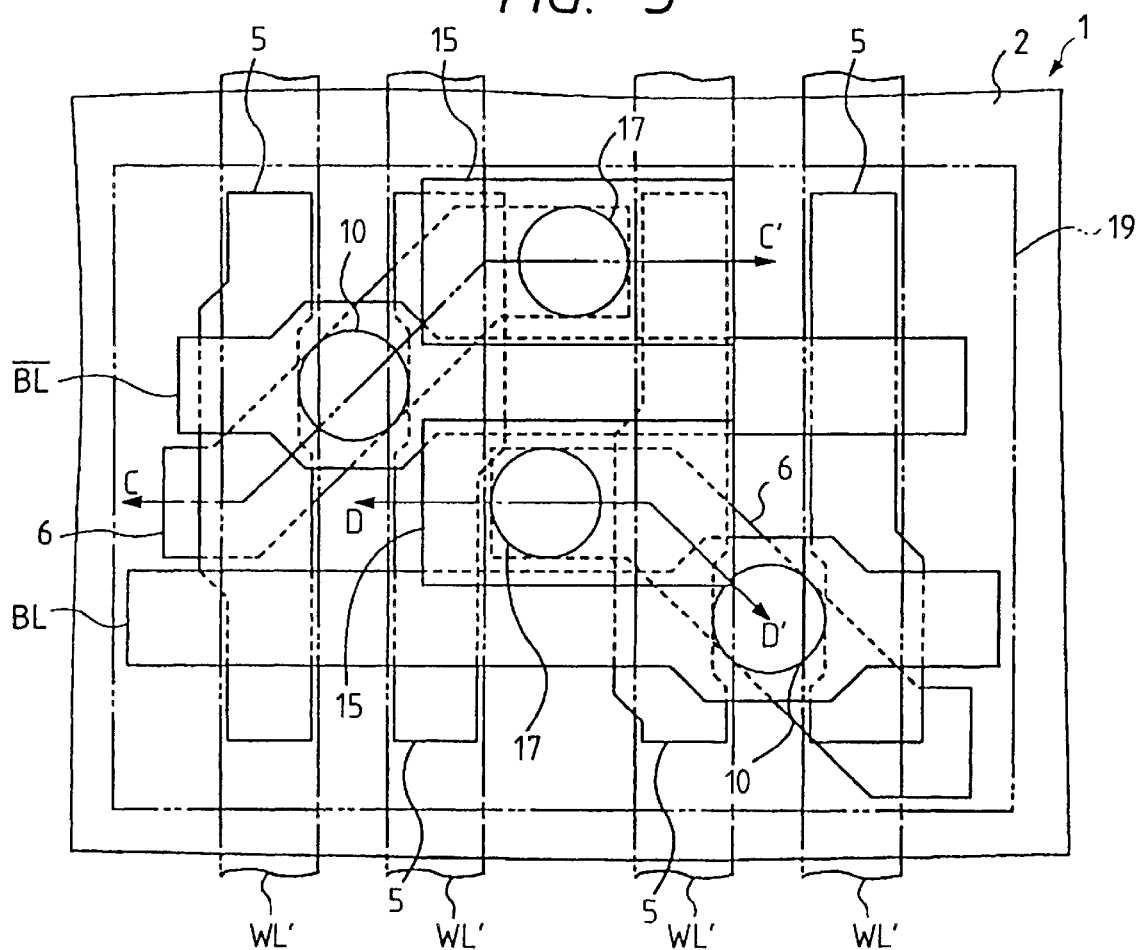
FIG. 3 is a plan view showing the layout of a DRAM memory cell of the embodiment.
Figure 4:
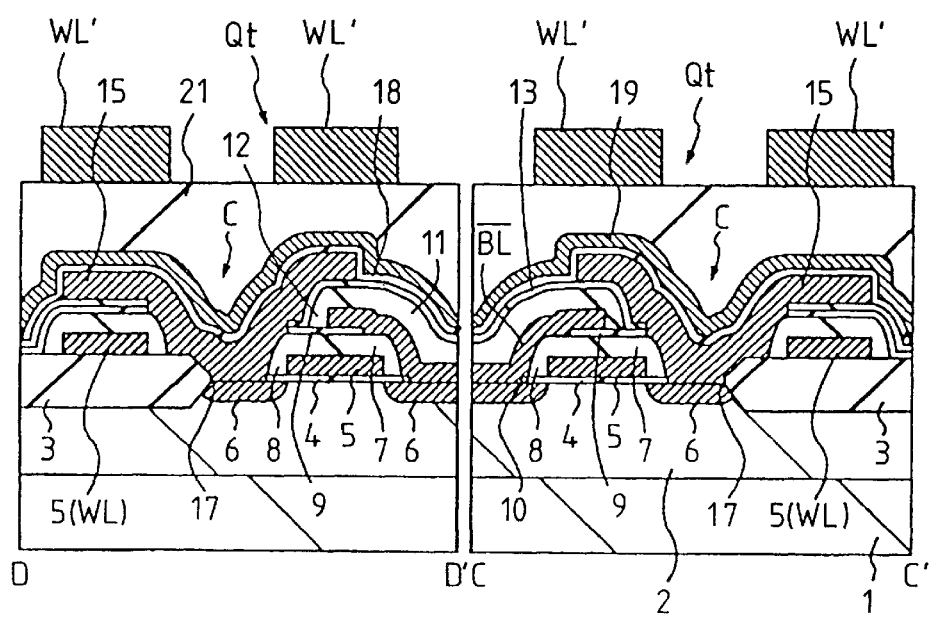
FIG. 4 is cross sections taken along the line C–C' and D–D' of FIG. 3.

FIG. 3 and 4 show the layout of other part (a portion consisting of only a memory cell) of the DRAM memory mat ($MM_1$–$MM_4$). Shown at right in FIG. 4 is a cross section taken along the line C–C' of FIG. 3 and at left a cross section taken along the line D–D'.

An example method of manufacturing the memory cell $MC_1$ and the n-channel MISFET Qs shown in FIG. 1 and FIG. 2 will be described by referring to FIG. 7 through FIG. 15.

First, the p type well 2, the field insulation film 3 and the gate insulation film 4 are formed successively on the main surface of the semiconductor substrate 1 by a known method (FIG. 7). Next, over the semiconductor substrate 1 are deposited a polysilicon film (first conductive film) and an insulation film (silicon oxide film) 7. With a photoresist as a mask, the insulation film 7 and the polysilicon film are etched to form the gate electrode 5 (the first word line $WL_1$) of the memory cell selection MISFET Qt and the gate electrode 5 of the n-channel MISFET Qs.

Then, with a photoresist film patterned on the insulation film 7 and the gate electrode 5 used as a mask, phosphorus is ion-implanted into the semiconductor substrate 1 to form the n type semiconductor region (source region and drain region) 6 of the memory cell selection MISFET Qt and the n type semiconductor region (source region and drain region) 6 of the n-channel MISFET Qs, in self-aligned with the insulation film 7 and the gate electrode 5. After this, the silicon oxide film deposited over the semiconductor substrate 1 is etched away by the reactive ion etching (RIE) to form the side wall spacer 8 at the side wall of the gate electrode 5 (FIG. 8). After the side wall spacer 8 is formed, arsenic (As) may be injected into the semiconductor substrate 1 in a concentration higher than the phosphorus, to make the source and drain regions of the n-channel MISFET Qs a lightly doped drain (LDD) structure.

As shown in FIG. 8 and FIGS. 1 and 2, in the DRAM of this embodiment, the gate electrode 5 of the n-channel MISFET Qs is directly connected to one n type semiconductor region 6 of the memory cell selection MISFET Qt through a contact hole 14 opened in the same insulation layer as the gate insulation film 4. That is, prior to the process of depositing the polysilicon film for the gate electrode 5, the contact hole 14 is formed in the same insulation layer as the gate insulation film 4 and then the polysilicon film (first conductive film) is deposited to directly connect the gate electrode 5 of the n-channel MISFET Qs to the n type semiconductor region 6 of the memory cell selection MISFET Qt without interposing any conductive layer between them.

Next, the insulation film (silicon oxide film) 9 is deposited over the semiconductor substrate 1 and, with the photoresist as a mask, the insulation film 9 and the insulation film (the same insulation layer as the gate insulation film 4) are etched away to form contact holes 10 over one n type semiconductor region 6 of the memory cell selection MISFET Qt and over one n type semiconductor region 6 of the n-channel MISFET Qs (FIG. 9).

Next, a polysilicon film (second conductive film) and the insulation film (silicon oxide) 11 are deposited successively on the semiconductor substrate 1. With the photoresist as a mask, the insulation film 11 and the polysilicon film are etched to form the bit lines (BL, $\overline{BL}$). The bit line (BL) is connected to one n type semiconductor region 6 of the memory cell selection MISFET Qt through the contact hole 10. Another bit line ($\overline{BL}$) is connected to one n type semiconductor region 6 of the n-channel MISFET Qs through the contact hole 10. Then, the silicon oxide film deposited over the semiconductor substrate 1 is etched away by the RIE method to form side wall spacers 12 at the side walls of the bit lines (BL, $\overline{BL}$) (FIG. 10).

Figure 11:
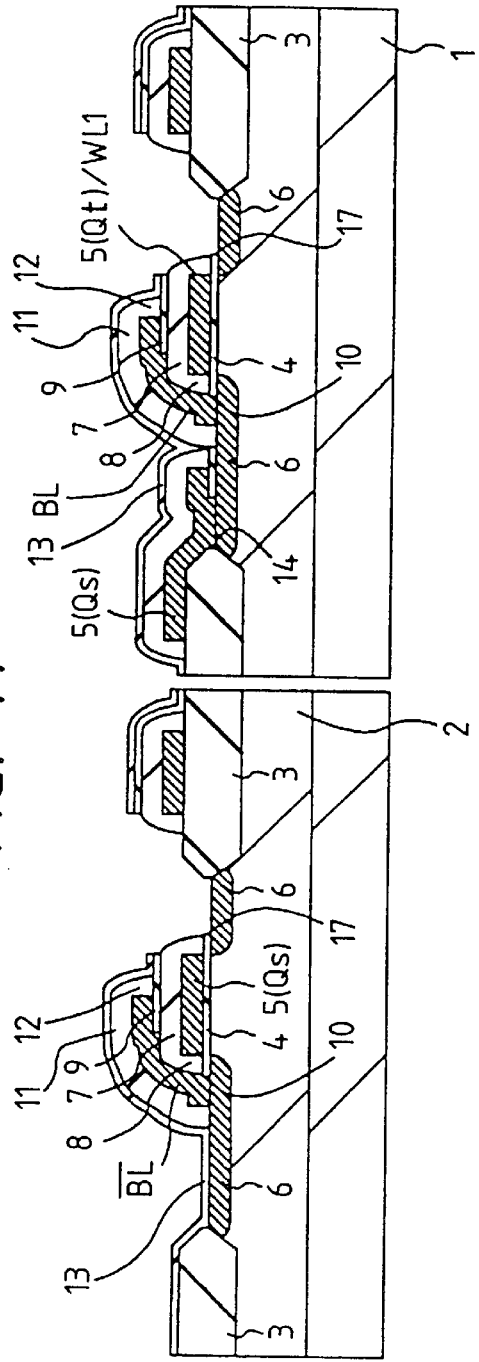
FIG. 11 is a cross section of an essential portion of a semiconductor substrate showing the method of manufacturing a DRAM of the first embodiment of this invention.

An insulation film (silicon oxide film) 13 is deposited over the semiconductor substrate 1 and, with the photoresist as a mask, the insulation films 13, 9 and the insulation film (the same insulation layer as the gate insulation film 4) are etched away to form contact holes 17 over the other n type semiconductor region 6 of the memory cell selection MISFET Qt and over the other n type semiconductor region 6 of the n-channel MISFET Qs (FIG. 11).

Figure 12:
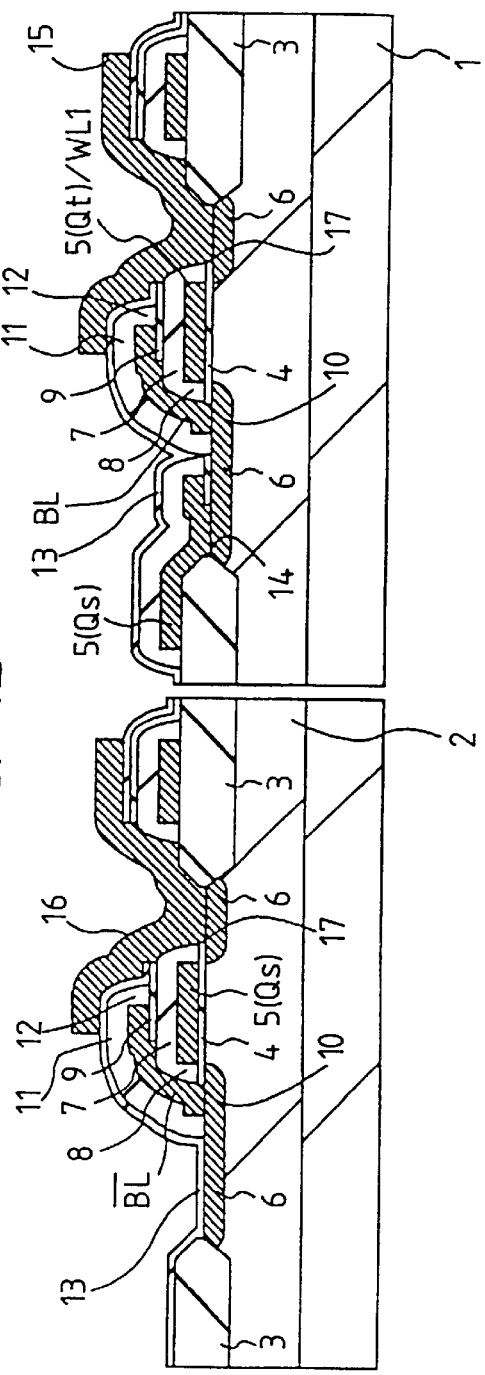
FIG. 12 is a cross section of an essential portion of a semiconductor substrate showing the method of manufacturing a DRAM of the first embodiment of this invention.

Next, a polysilicon film (third conductive film) is deposited over the semiconductor substrate 1 and, with the photoresist as a mask, the polysilicon film is etched away to form the storage node 15 and the pad layer 16. The storage node 15 is connected to the second n type semiconductor region 6 of the memory cell selection MISFET Qt through the contact hole 17; and the pad layer 16 is connected to the second n type semiconductor region 6 of the n-channel MISFET Qs through the contact hole 17 (FIG. 12).

Next, a silicon nitride film and a silicon oxide film are successively deposited over the semiconductor substrate 1 to form an insulation film 18 that constitutes a dielectric film of the capacitor C. This is followed by the etching of the insulation film 18, with the photoresist as a mask, to selectively remove an area of the insulation film that forms the sense amplifier NSA (FIG. 13).

Then, a polysilicon film (fourth conductive film) is deposited over the semiconductor substrate 1 and, with the photoresist as a mask, is etched away in areas where the sense amplifier NSA is to be formed in order to form the plate electrode 19 of the capacitor C (FIG. 14).

Figure 15:
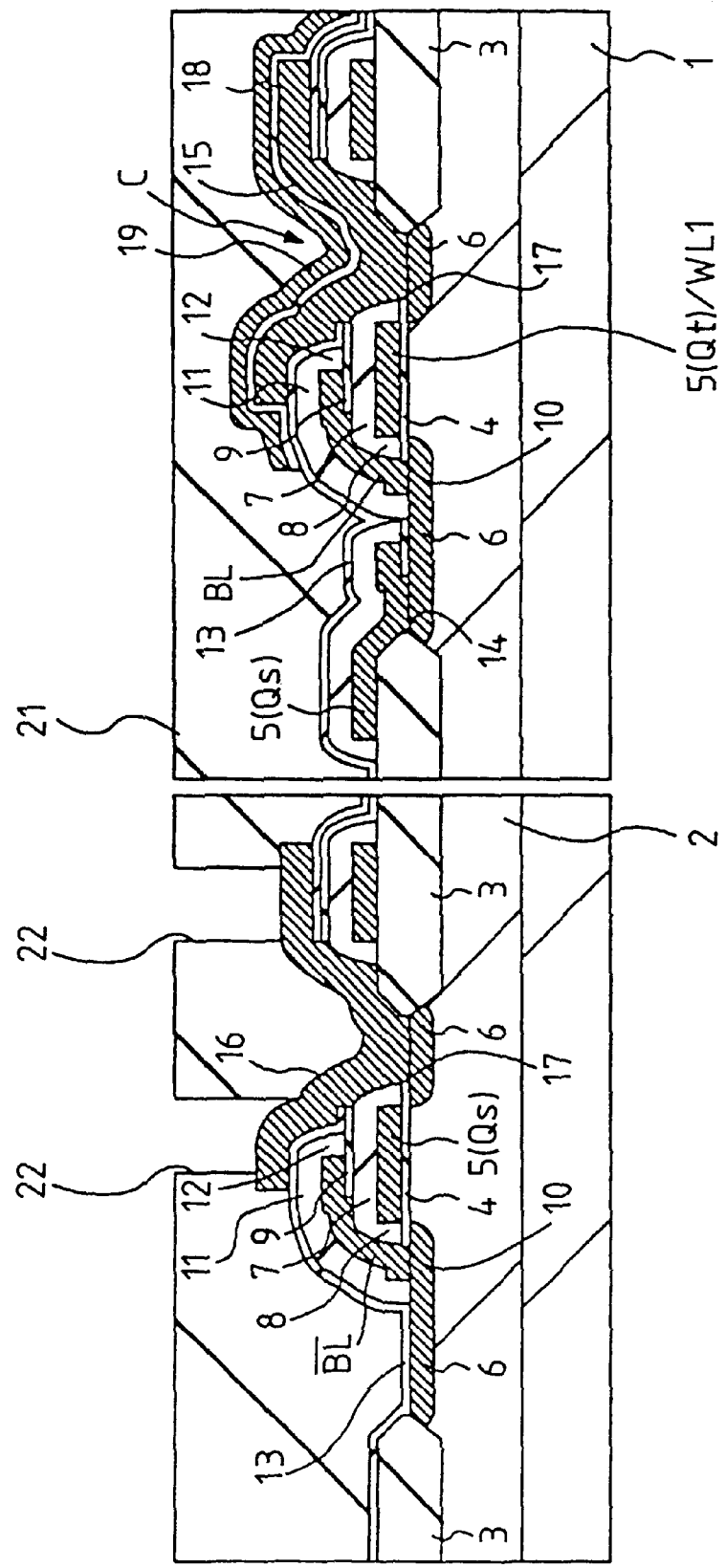
FIG. 15 is a cross section of an essential portion of a semiconductor substrate showing the method of manufacturing a DRAM of the first embodiment of this invention.

Next, an interlayer insulation film 21 is deposited over the semiconductor substrate 1 and then etched with the photoresist as a mask to form a contact hole 22 in the interlayer insulation film 21 (FIG. 15). The interlayer insulation film 21 is a laminated film consisting of a silicon oxide film about 200–300 nm deposited by the CVD method and a BPSG film about 500–600 nm. The BPSG film is planarized in its surface by being reflowed at temperatures of 900–950° C. While in this embodiment, two contact holes 22 are formed over the pad layer 16 to reduce the contact resistance between the pad layer 16 and the common source line $PN_1$, the number of contact hole 22 may be one or three or more.

After this, the fifth conductive film (a three-layer film of TiW film, aluminum alloy film and TiW film) deposited over the interlayer insulation film 21 is etched away to form the common source line $PN_1$ and the second word lines $WL_1$, $WL_2$, . . . thus completing the memory cell $MC_1$ and the n-channel MISFET Qs shown in FIG. 1 and 2.

In this way, in the DRAM of this embodiment, the n type semiconductor region 6 of the paired n-channel MISFETs Qs that form the sense amplifier NSA adjacent to the memory cell $MC_1$ is electrically connected to the common source line $PN_1$ through the pad layer 16, which was formed of the same third layer conductive film as the storage node 15 of the memory cell $MC_1$.

This construction allows the aspect ratio of the contact hole 22 opened in the interlayer insulation film 21 over the pad layer 16 to be smaller than when no pad layer 16 is provided, thereby improving the processing accuracy of the contact hole 22 and the connection reliability of the common source line $PN_1$ in the contact hole 22. This in turn obviates the need to provide the step buffer region between the memory cell $MC_1$ and the sense amplifier NSA.

This construction also allows the n-channel MISFET Qs of the sense amplifier NSA to be formed in almost the same shape and dimension as the memory cell selection MISFET Qt of the memory cell $MC_1$. In other words, the sense amplifier NSA constituting the latch circuit can be formed of the paired n-channel MISFETs Qs using a memory cell area of about two bits.

Because the effective area occupied by the sense amplifier NSA can be reduced, the area of the semiconductor substrate 1 can also be reduced, allowing the number of chips manufactured in one wafer to be increased.

Figure 16:
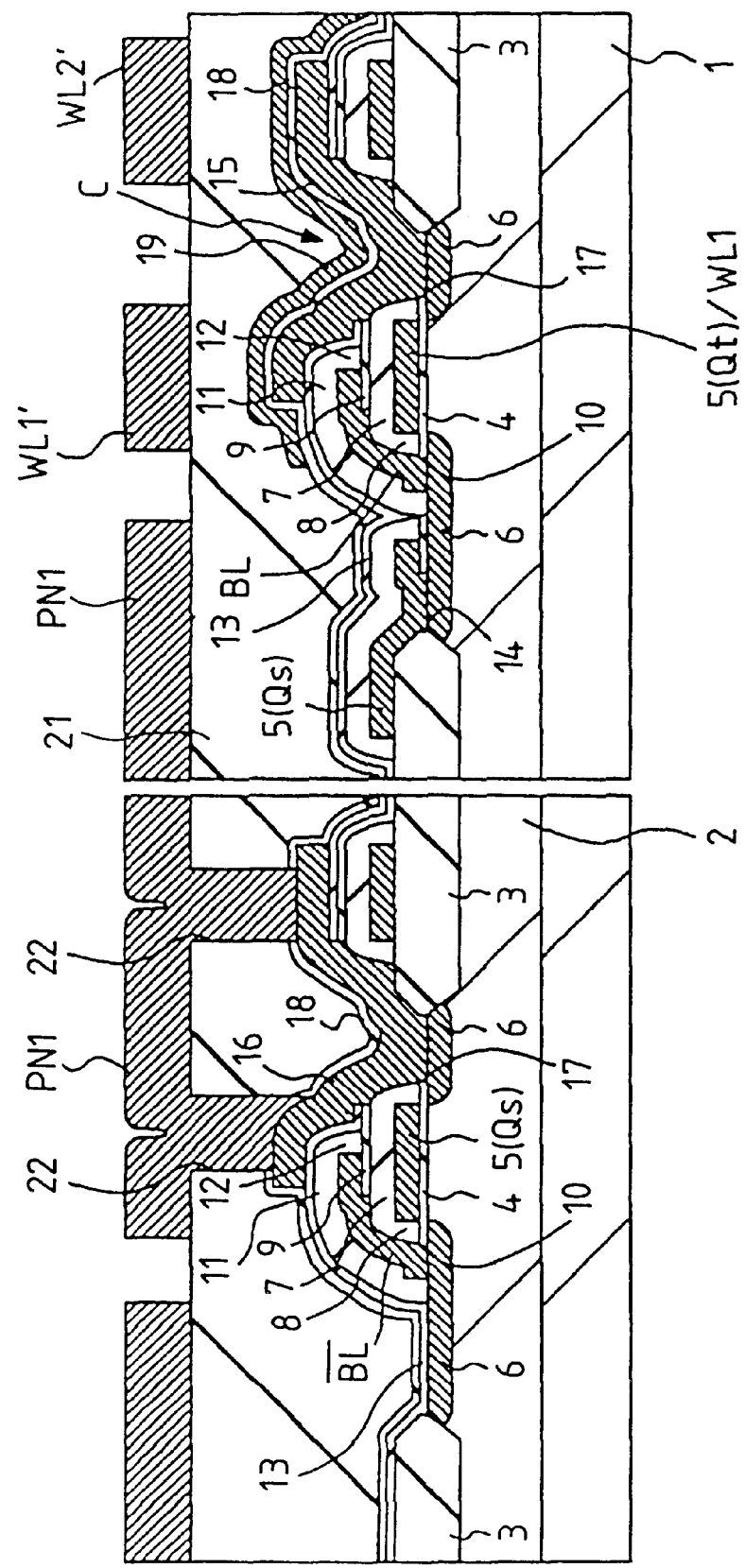
FIG. 16 is a cross section of an essential portion of a semiconductor substrate showing the method of manufacturing a DRAM of a further embodiment of this invention.

While in the above manufacturing method, the insulation film 18 (dielectric film of the capacitor C) in the region where the sense amplifier NSA is formed was selectively removed (refer to FIG. 13), it is also possible to leave the insulation film 18 in the region where the sense amplifier NSA is formed, as shown in FIG. 16. In this case, because the contact hole 22 can be formed by etching the interlayer insulation film 21 and the insulation film 18 with the same mask, the step for etching only the insulation film 18 can be eliminated, reducing the number of steps in the DRAM making process.

Figure 17:
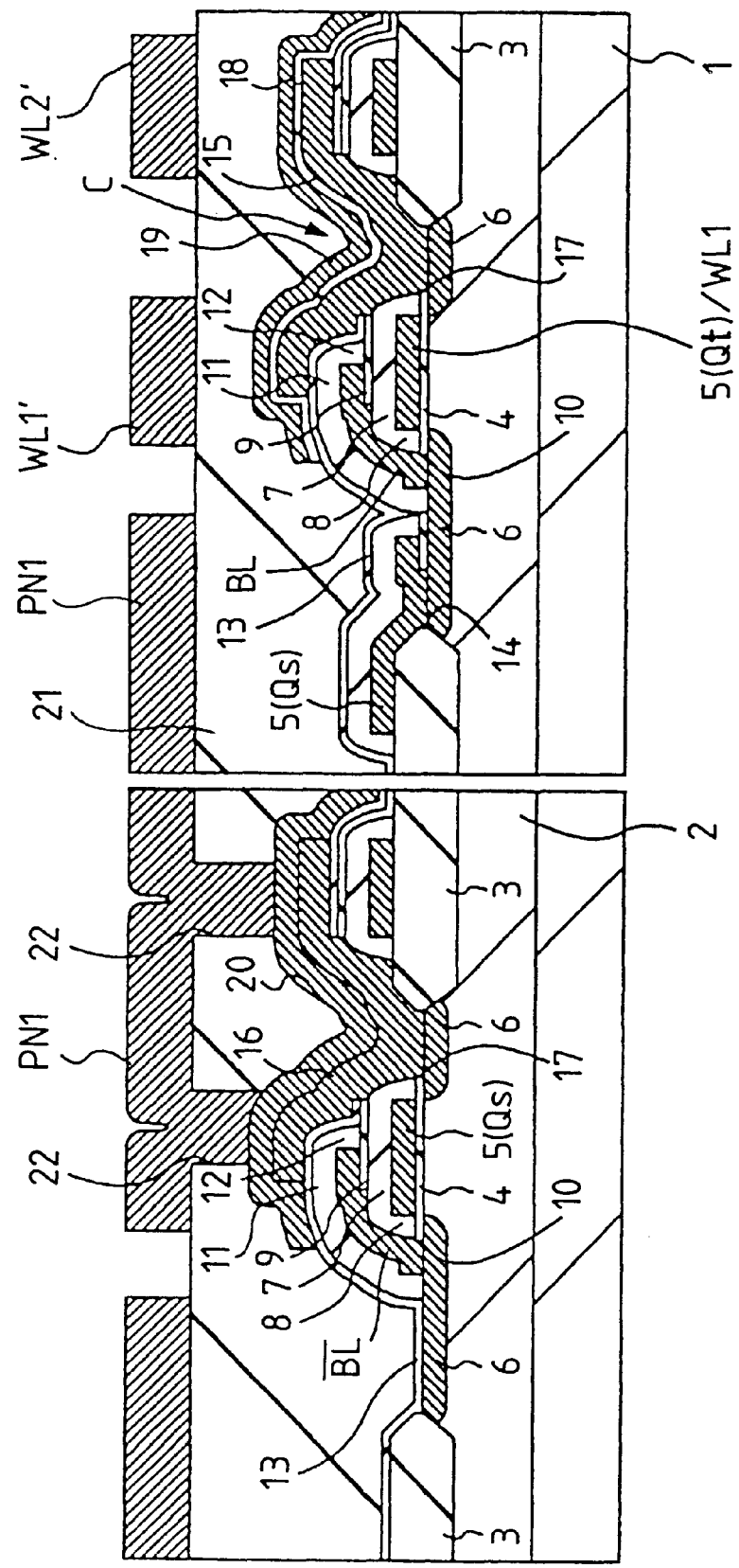
FIG. 17 is a cross section of an essential portion of a semiconductor substrate showing the method of manufacturing a DRAM of a further embodiment of this invention.

Further, in this embodiment, the pad layer 16 formed of the same third layer conductive film as the storage node 15 of the memory cell $MC_1$ is interposed between the n type semiconductor region 6 of the n-channel MISFET Qs and the common source line $PN_1$. As shown in FIG. 17, it is possible to provide over the pad layer 16 a second pad layer 20, which is formed of the same fourth conductive film as the plate electrode 19 of the memory cell $MC_1$, in order to connect the n type semiconductor region 6 to the common source line $PN_1$ through these two pad layers 16, 20. In this case, the insulation film 18 over the pad layer 16 should be eliminated to connect the pad layer 20 directly to the underlying pad layer 16. With this configuration, the aspect ratio of the contact hole 22 formed in the interlayer insulation film 21 over the pad layer 20 can be made smaller, thus further improving the process accuracy of the contact hole 22 and the connection reliability of the common source line $PN_1$ in the contact hole 22.

Figure 18:
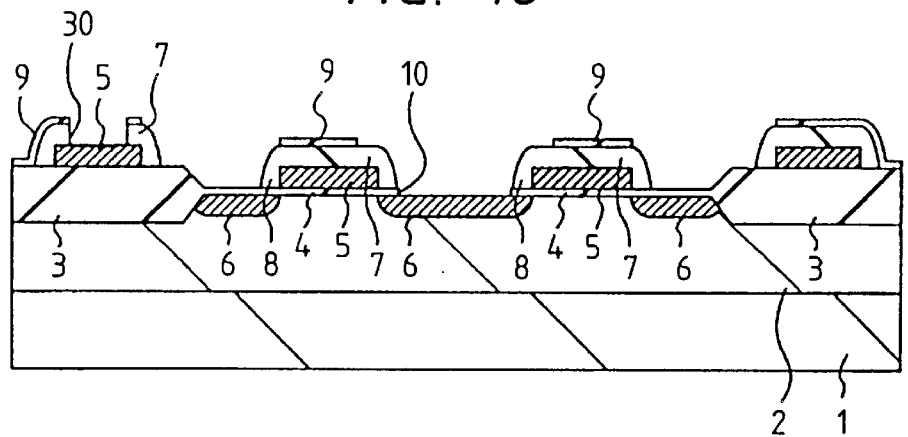
FIG. 18 is a cross section of an essential portion of a semiconductor substrate showing the method of manufacturing a DRAM of a further embodiment of this invention.
Figure 19:
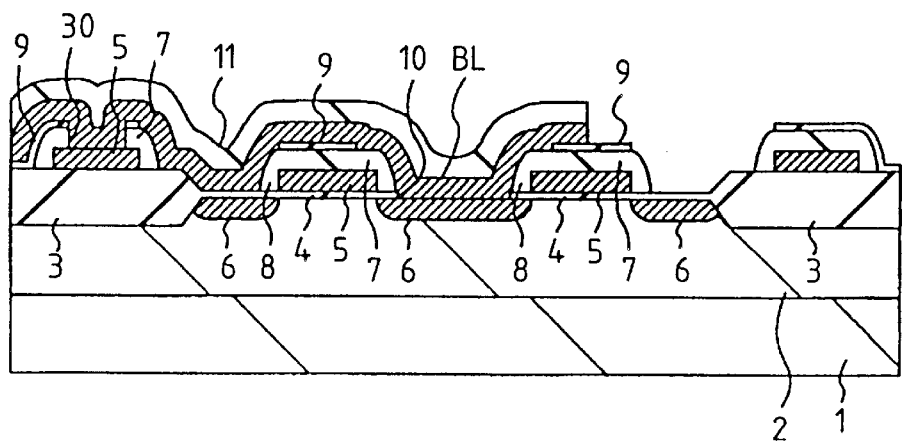
FIG. 19 is a cross section of an essential portion of a semiconductor substrate showing the method of manufacturing a DRAM of a further embodiment of this invention.

An example connection structure of the gate electrode 5 and the bit line (BL) in the memory mat ($MM_1$–$MM_4$), which is suitably used in combination with the manufacturing method of this embodiment, is described by referring to FIG. 18 and 19.

After the process of FIG. 9 is finished, the insulation films 7, 9 over the gate electrode 5, which is to be connected to the bit line (BL), are selectively removed to form a contact hole 30 (FIG. 18). Then, a polysilicon film (second conductive film) and an insulation film (silicon oxide film) 11 are deposited successively over the semiconductor substrate 1 and then etched away to form the bit line (BL) thus connecting the bit line (BL) and the gate electrode 5 through the contact hole 30 (FIG. 19).

Figure 20:
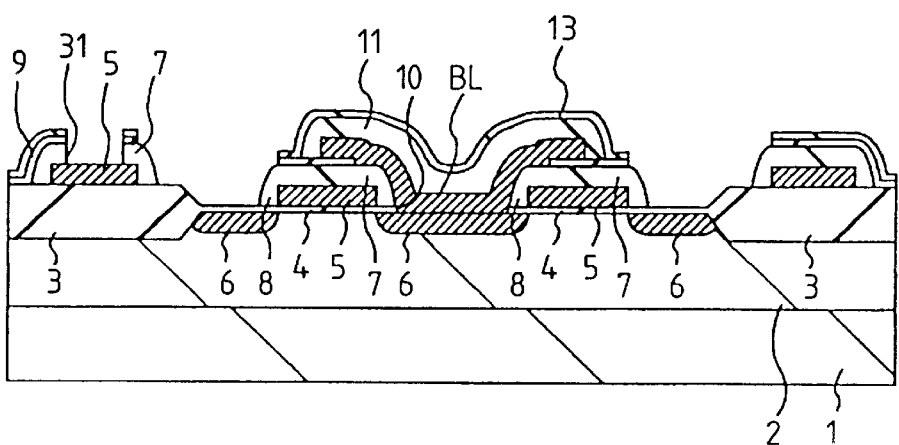
FIG. 20 is a cross section of an essential portion of a semiconductor substrate showing the method of manufacturing a DRAM of a further embodiment of this invention.
Figure 21:
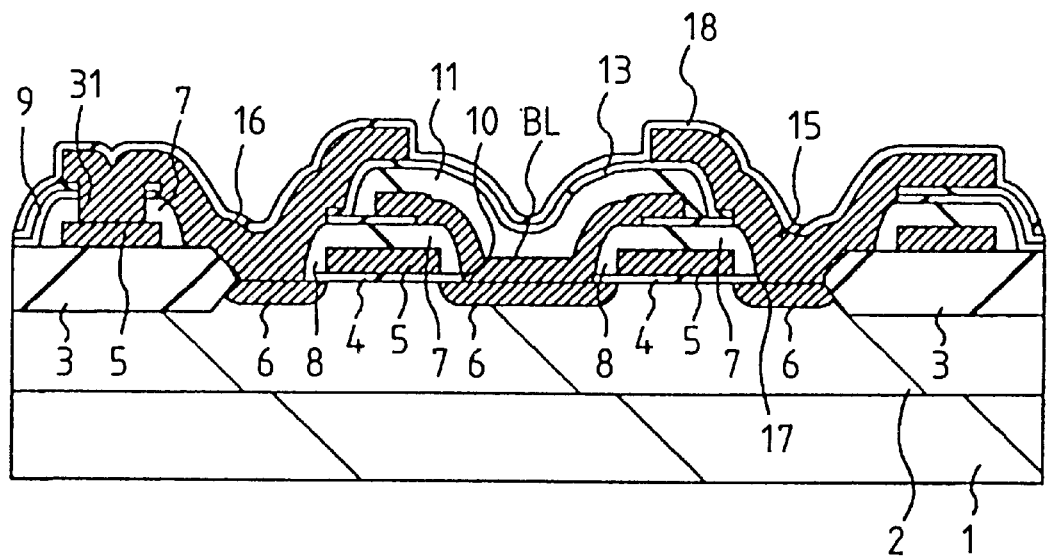
FIG. 21 is a cross section of an essential portion of a semiconductor substrate showing the method of manufacturing a DRAM of a further embodiment of this invention.

An example connection structure of the gate electrode 5 and the pad layer 16 in the memory mat ($MM_1$–$MM_4$), which is suitably used in combination with the manufacturing method of this embodiment, is explained by referring to FIG. 20 and 21.

After the process of FIG. 11 is finished, the insulation films 7, 9 over the gate electrode 5, which is to be connected to the pad layer 16, are selectively removed to form a contact hole 31 (FIG. 20). Then, a polysilicon film (third conductive film) is deposited successively over the semiconductor substrate 1 and then etched away to form the pad layer 16 thus connecting the pad layer 16 and the gate electrode 5 through the contact hole 31 (FIG. 21). And then, an insulation film 18 which constitutes a dielectric film of the capacitor C is deposited over the storage node 15 and the pad layer 16 (FIG. 21).

Figure 22:
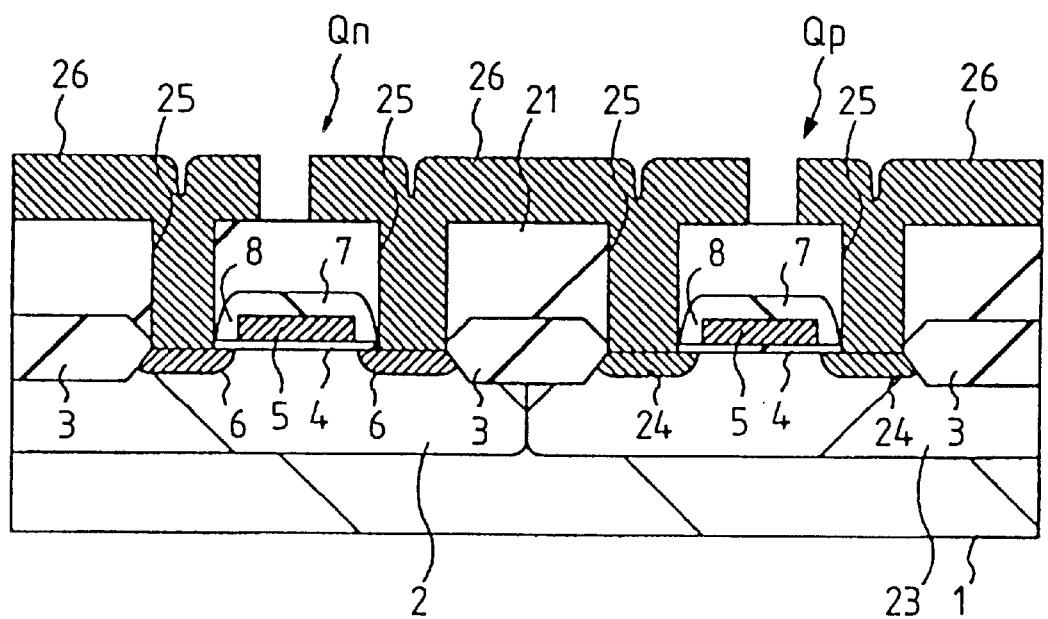
FIG. 22 is a cross section of an essential portion of a semiconductor substrate showing the method of manufacturing a DRAM of a further embodiment of this invention.

FIG. 22 is a fragmentary cross section showing a peripheral control circuit (CMOS inverter), which is an example peripheral circuit other than the direct peripheral circuit made by the manufacturing method of this embodiment.

The CMOS inverter consists of an n-channel MISFET Qn formed on the main surface of the p type well 2 and a p-channel MISFET Qp formed on the main surface of the n type well 23. The gate electrodes 5 of the n-channel MISFET Qn and the p-channel MISFET Qp are formed of the first conductive film simultaneously with the process of forming the gate electrodes 5 of the memory cell selection MISFET Qt of the memory cell $MC_1$ and of the n-channel MISFET Qs of the sense amplifier NSA.

Interconnections 26 are connected, through contact holes 25 formed in the interlayer insulation film 21, to the n type semiconductor region 6 of the n-charnel MISFET Qn and to the p type semiconductor region 24 of the p-channel MISFET Qp. The contact holes 25 are formed simultaneously with the process of forming the contact holes 22 in the interlayer insulation film 21 over the pad layer 16 of the n-channel MISFET Qs of the sense amplifier NSA. The interconnections 26 are formed of the same fifth conductive film as the common source line $PN_1$ simultaneously with the process of forming the common source line $PN_1$. In this way, the fifth conductive film is directly connected to the source and drain regions of the MISFETs Qn, Qp that form the peripheral circuit other than the direct peripheral circuit.

In the DRAM of this embodiment, because the n-channel MISFET Qs of the sense amplifier NSA adjacent to the memory cell $MC_1$ and the common source line $PN_1$ are connected through the pad layer 16, the aspect ratio of the contact hole 22 formed in the interlayer insulation film 21 over the pad layer 16 can be made almost equal to that of the contact hole 25 formed in the interlayer insulation film 21 in the low-altitude peripheral circuit region such as the CMOS inverter.

Figure 23:
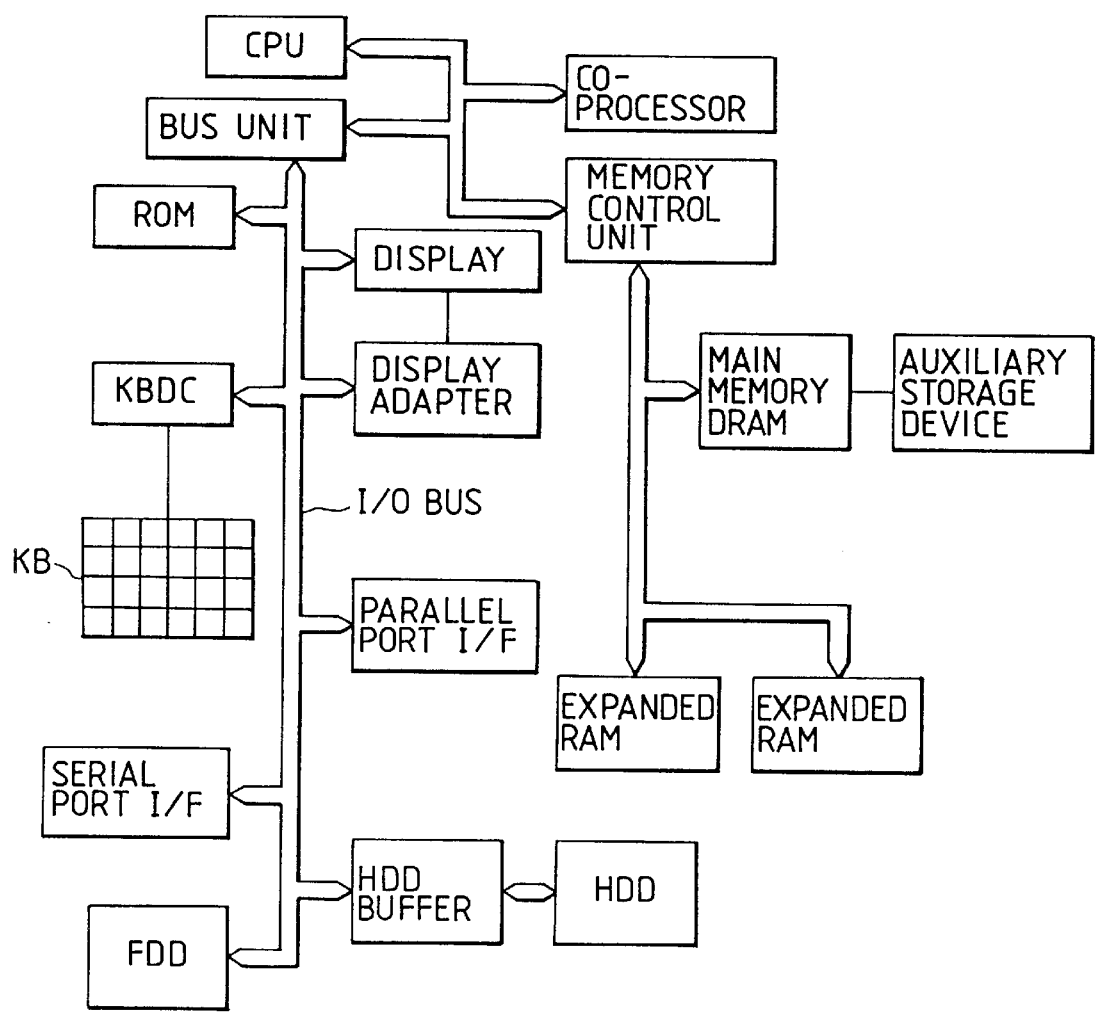
FIG. 23 is a block diagram showing an example workstation system using the DRAM of this invention.

FIG. 23 is a block diagram showing an example workstation system using the DRAM of this embodiment.

This workstation system uses the high-density DRAM of this embodiment for the main memory DRAM and the expanded RAM. With this configuration, it is possible to obtain a workstation system equipped with a large-capacity memory in a small mounting area.

Embodiment 2

Figure 24:
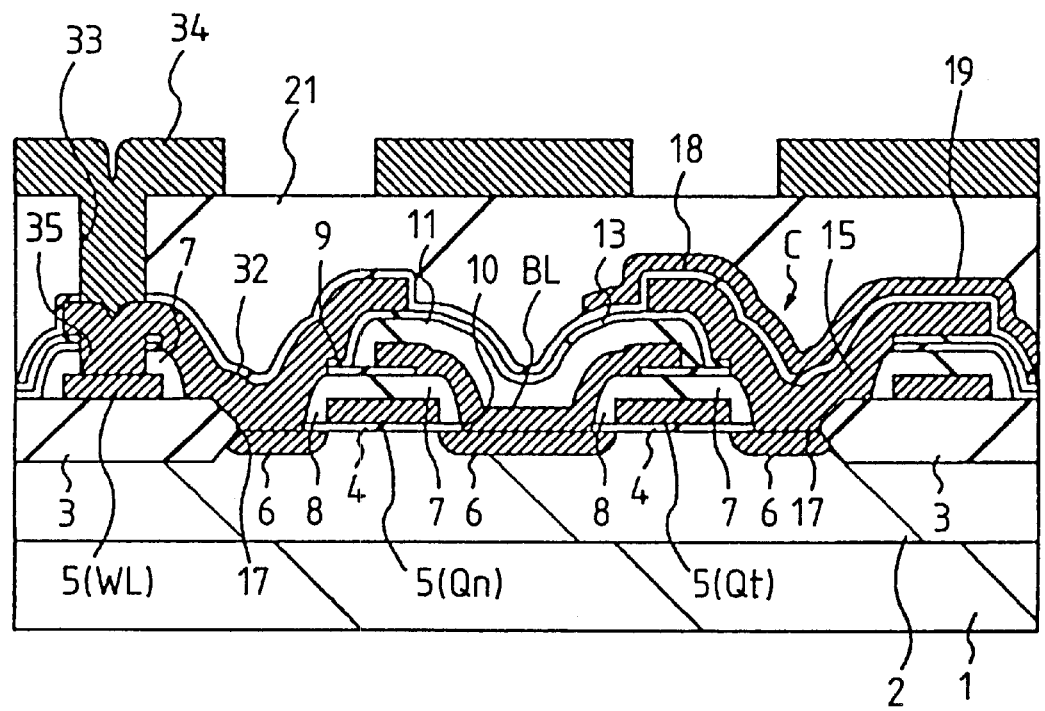
FIG. 24 is a cross section of a further embodiment of this invention showing a part of a DRAM memory cell and of a direct peripheral circuit formed adjacent to the memory cell.
Figure 25:
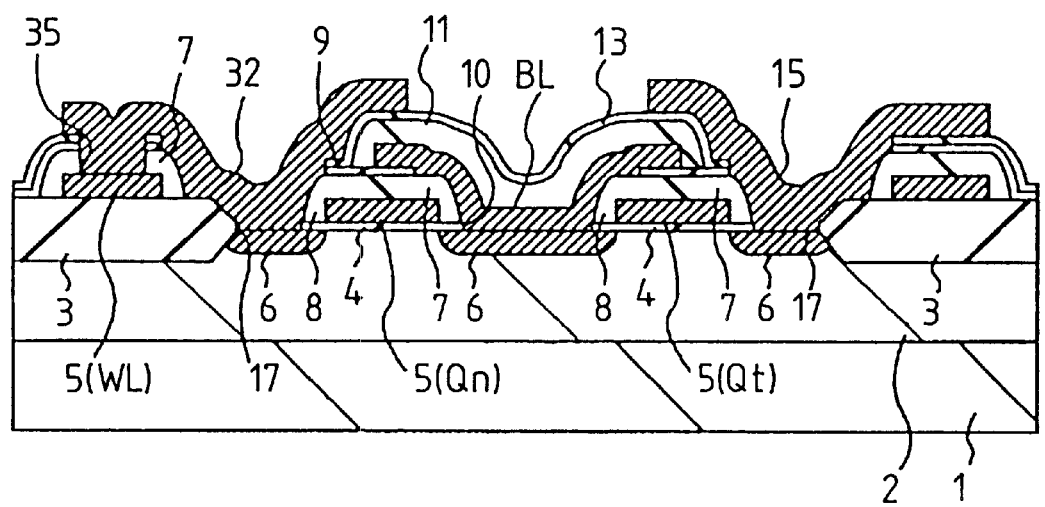
FIG. 25 is a cross section of an essential portion of a semiconductor substrate showing the method of manufacturing a DRAM of a further embodiment of this invention.

FIG. 24 is a cross section of a second embodiment showing a part of the DRAM memory array and of the direct peripheral circuit (word shunt).

The large-capacity DRAM has the word line (WL) shunted at the back with a metal interconnection line of, say, aluminum alloy to reduce delay time of the word line (WL) made of a polysilicon film. Here, the shunting interconnection 34 (an interconnection made of the same fifth conductive film as the common source line $PN_1$) and the word line (WL, the first conductive film) are connected together through a pad layer 32 formed of the same third conductive film as the storage node 15 of the memory cell.

To connect the shunting interconnection 34 and the word line (WL) through the pad layer 32 involves, after the process of FIG. 11, selectively removing the insulation films 7, 9 over the word line (WL), which is to be connected to the interconnection 34, to form a contact hole 35. Then, a third conductive film (polysilicon film) is deposited over the semiconductor substrate 1 and then etched away to form the pad layer 32, which is therefore connected to the word line (WL) through the contact hole 35.

Next, the insulation film 18 that constitutes a dielectric film of the capacitor C and the fourth conductive film (polysilicon film) are deposited one after another over the semiconductor substrate 1, and then the fourth conductive film is etched away to form the plate electrode 19 of the memory cell. Then, the interlayer insulation film 21 is deposited over the semiconductor substrate 1 and then etched away to form a contact hole 35, after which the fifth conductive film (a three-layer film consisting of TiW film, aluminum alloy film and TiW film) deposited over the interlayer insulation film 21 is etched away to form an interconnection 34.

According to this embodiment, because the aspect ratio of the contact hole 33 formed in the interlayer insulation film 21 can be reduced, there is no need to provide the step buffer region between the memory cell MC and the word shunt portion. This reduces the effective area occupied by the word shunt portion, which in turn results in a reduction in the area of the semiconductor chip 1 and therefore an increase in the number of chips produced per unit wafer. It is noted that the n-channel MISFET Qn formed in the word shunt portion is a dummy MISFET which does not function as a transistor.

Embodiment 3

Figure 26:
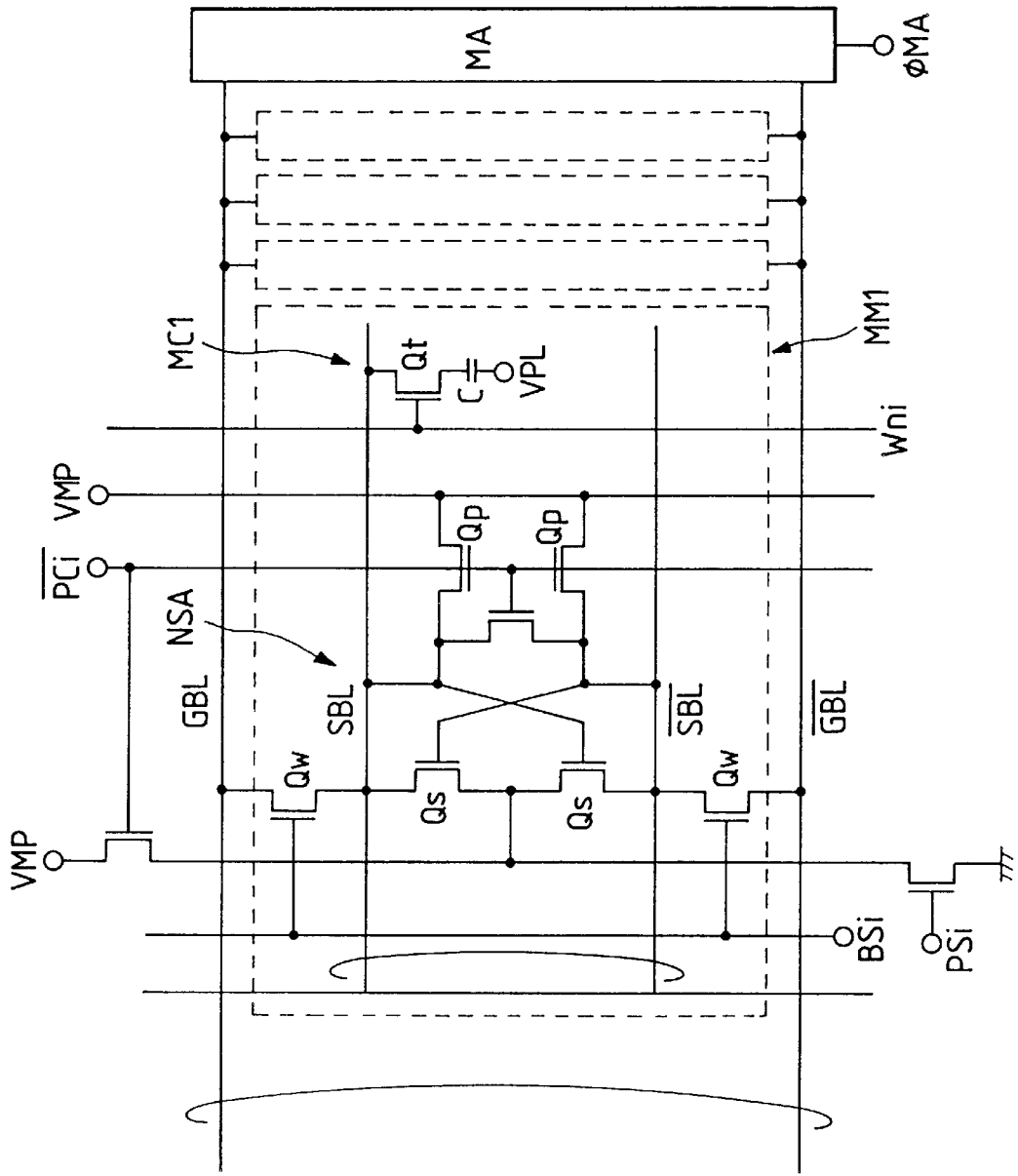
FIG. 26 is a circuit diagram of the second embodiment of this invention showing a part of a DRAM memory array and of a direct peripheral circuit.
Figure 27:
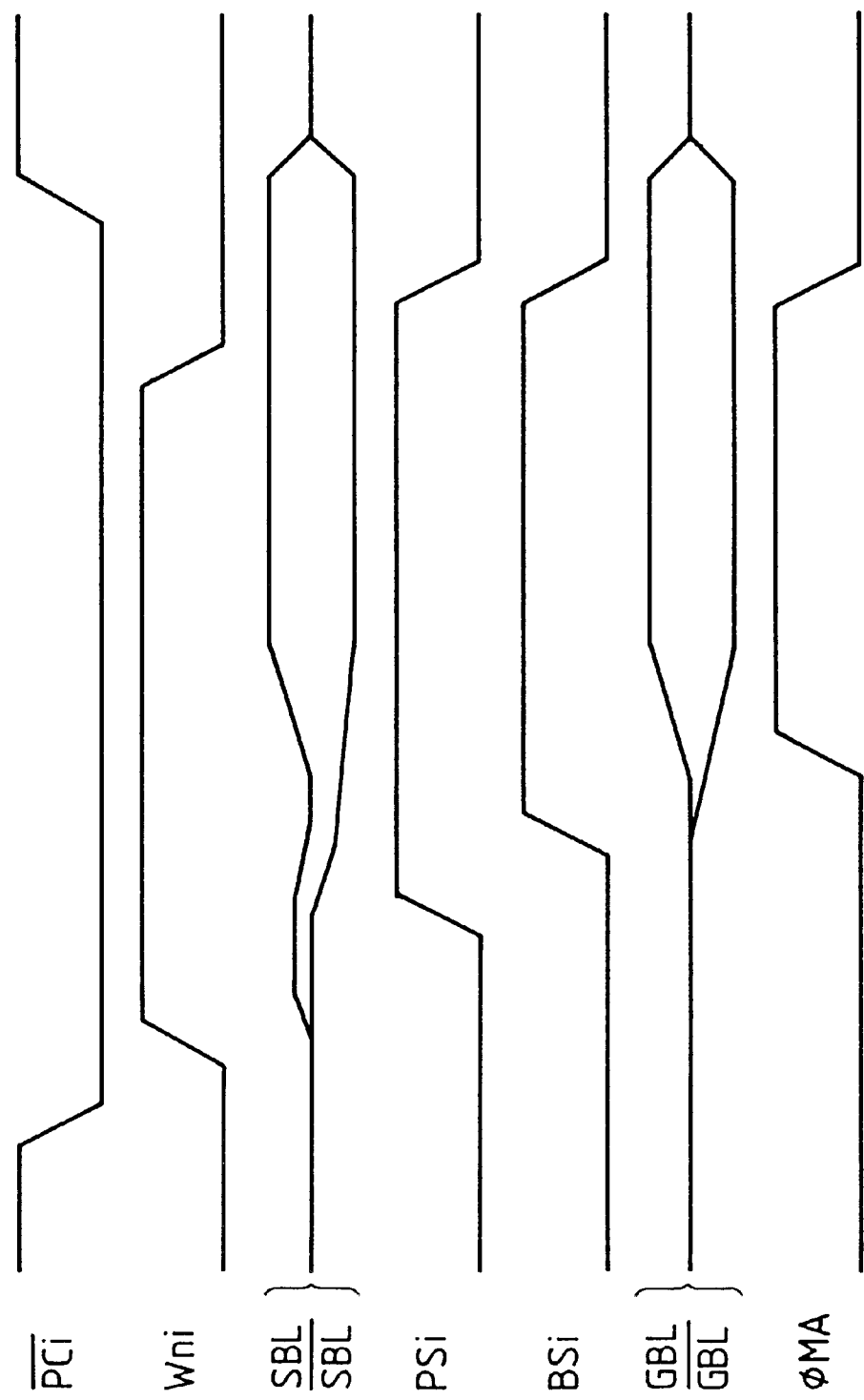
FIG. 27 is a timing chart showing the operation of the circuit of FIG. 26.

FIG. 26 is a circuit diagram of this embodiment showing a part of the DRAM memory array and of the direct peripheral circuit (sense amplifier). FIG. 27 is a timing chart when reading the sense amplifier of FIG. 26.

The memory mat MM of the DRAM of this embodiment consists of a pair of segment bit lines (SBL, $\overline{SBL}$), a pair of global bit lines (GBL, $\overline{GBL}$), and a sense amplifier NSA having a latch circuit formed of a pair of n-channel MISFETs Qs.

Data written into the memory cell MC is, during the read operation, transmitted to the segment bit lines (SBL, $\overline{SBL}$) and is pre-sensed by the sense amplifier NSA before being transmitted to the global bit lines (GBL, $\overline{GBL}$) and amplified by a main amplifier MA (equivalent to a main sense amplifier).

The segment bit lines (SBL, $\overline{SBL}$) are formed of the second conductive film (polysilicon film); and the global bit lines (GBL, $\overline{GBL}$) are formed of the fifth conductive film (a three-layer film consisting of TiW film, aluminum alloy film and TiW film).

In the DRAM of this embodiment, through the pad layer formed of the same third conductive film as the storage node of the memory cell MC are the global bit lines (GBL, $\overline{GBL}$) connected to an n-channel MISFET Qw that connects the segment bit lines (SBL, $\overline{SBL}$) and the global bit lines GBL, $\overline{GBL}$) together. Because this construction reduces the aspect ratio of the contact hole formed in the interlayer insulation film over the pad layer, it is not necessary to provide a step buffer zone between the memory cell MC and the sense amplifier NSA. It is also possible to form in almost the same geometry and dimension as the memory cell selection MISFET Qt the n-channel MISFET Qs of the sense amplifier NSA, the n-channel MISFET Qw connecting the segment bit lines (SBL, $\overline{SBL}$) and the global bit lines (GBL, $\overline{GBL}$), and the p-channel MISFET Qp for precharging the segment bit lines (SBL, $\overline{SBL}$). This in turn reduces the effective area occupied by the sense amplifier NSA and therefore the area of the semiconductor chip 1, allowing the number of chips manufactured in the single wafer to be increased.

Figure 28:
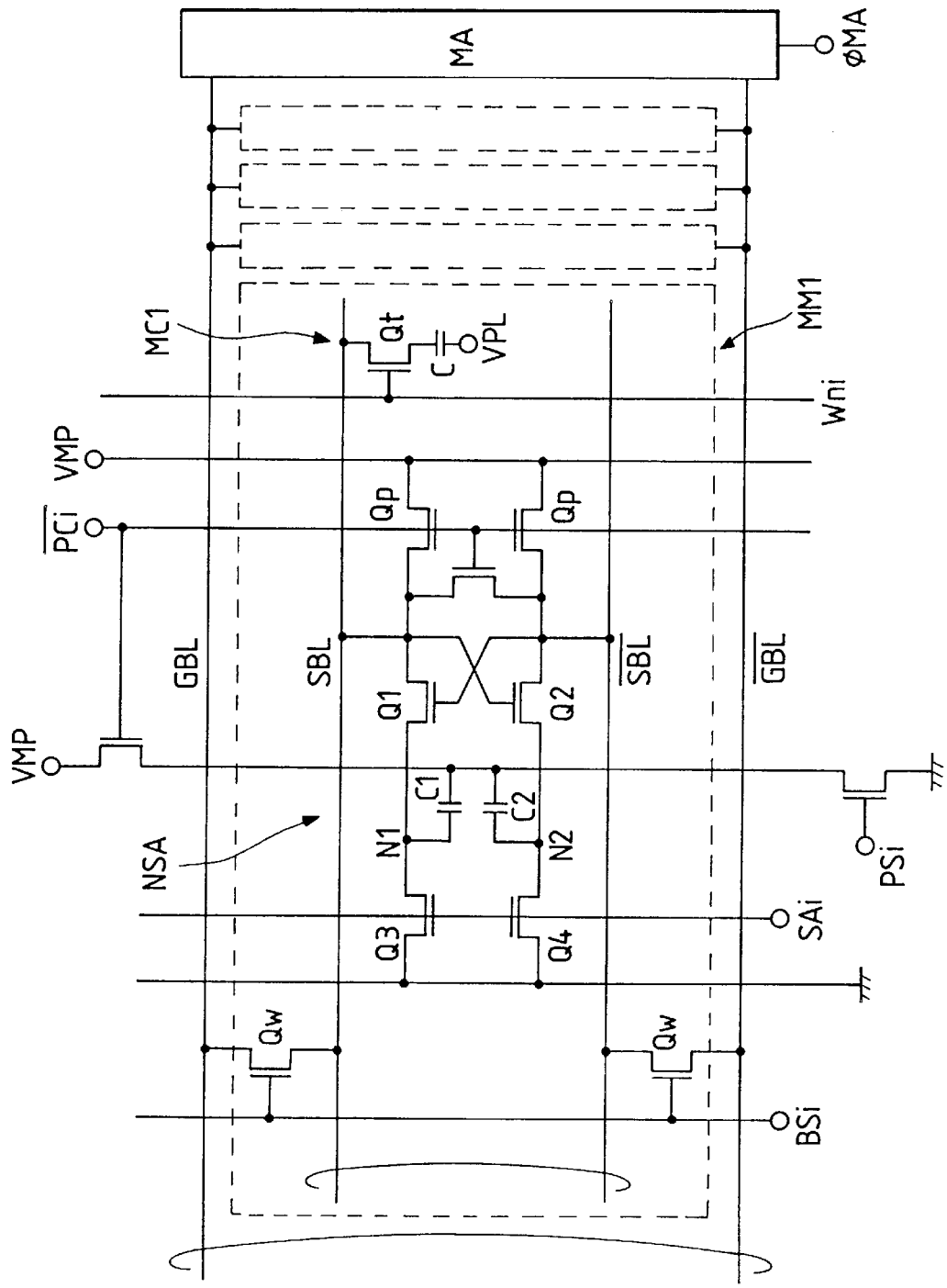
FIG. 28 is a circuit diagram of the second embodiment of this invention showing a part of a DRAM memory array and of a direct peripheral circuit.

FIG. 28 is a variation of this embodiment, in which the sense amplifier NSA is formed as a threshold voltage (Vth) variation compensation type. This sense amplifier NSA, during precharging, picks up as the potential difference between the nodes ($N_1$, $N_2$) the difference between the threshold (Vth) variations of the paired n-channel MISFETs $Q_1$ and $Q_2$ that form the latch circuit and thereby compensates for the threshold variations. The sense amplifier NSA is driven via coupling capacitances ($C_1$, $C_2$). This first driving of the sense amplifier NSA is termed as a pre-sense operation, which is followed by the drive n-channel MISFETs $Q_3$, $Q_4$ being turned on to amplify the segment bit lines (SBL, $\overline{SBL}$).

Figure 29:
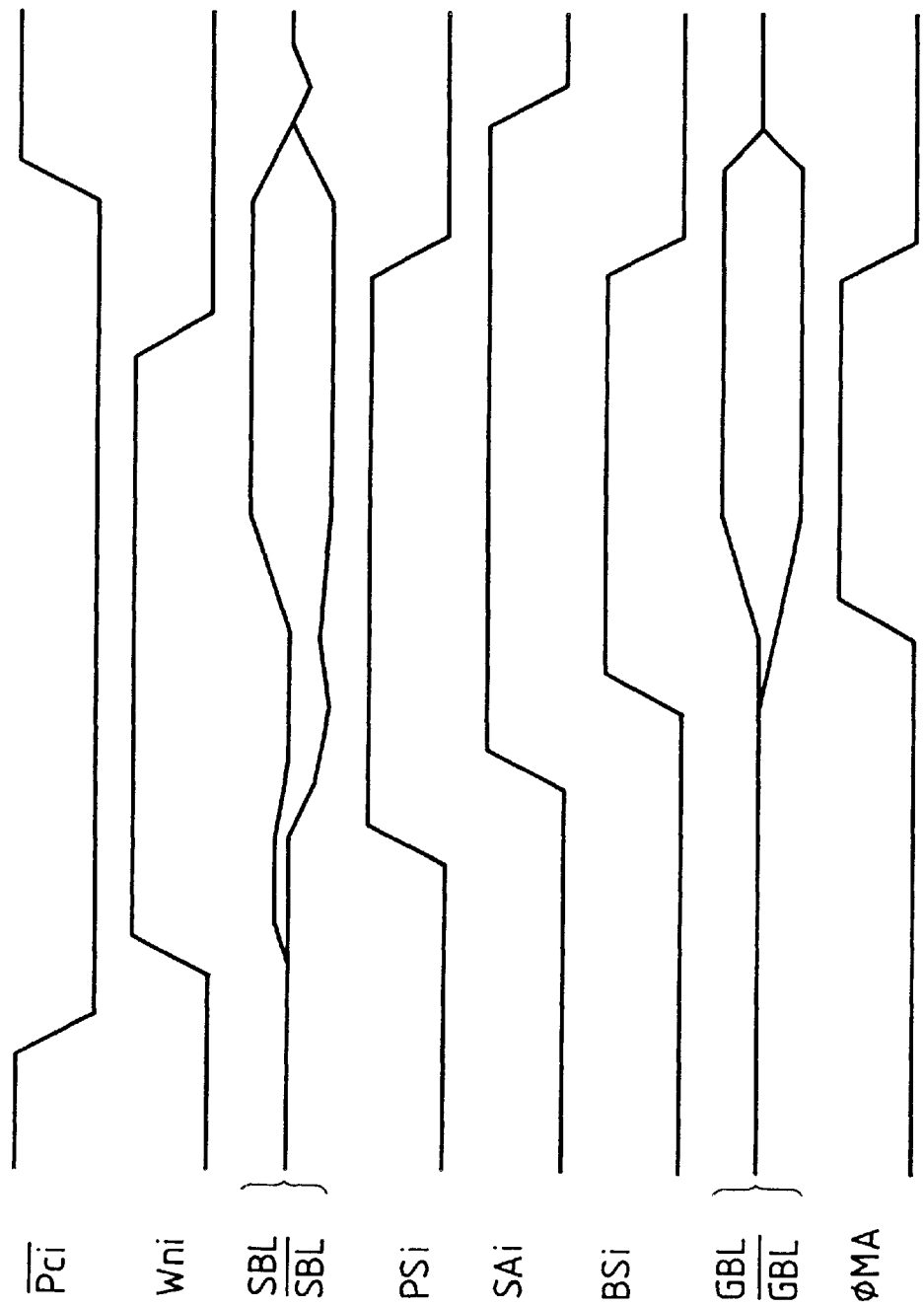
FIG. 29 is a timing chart showing the operation of the circuit of FIG. 28.

As shown in FIG. 29, during the data read operation, PSi is held high to start driving the sense amplifier NSA through the coupling capacitances ($C_1$, $C_2$). Next, SAi is held high to amplify the segment bit lines (SBL, $\overline{SBL}$) and then BSi is held high to transfer the read data to the global bit lines (GBL, $\overline{GBL}$) for amplification by the main amplifier MA.

In this example, by forming the coupling capacitances ($C_1$, $C_2$) in the same structure as the capacitor C of the memory cell MC and manufacturing them in the same process, it is possible to further reduce the effective area occupied by the sense amplifier NSA.

Figure 30:
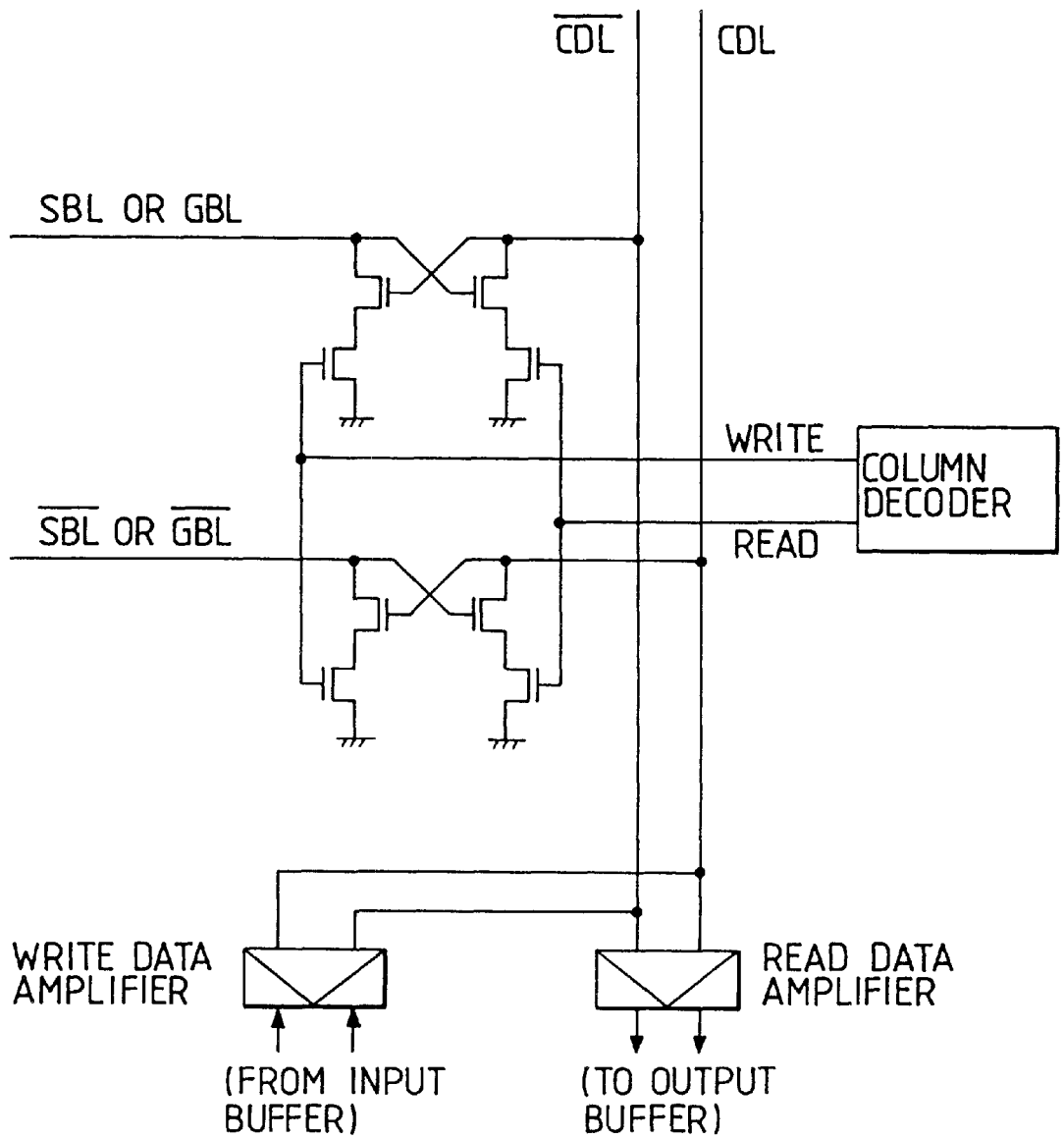
FIG. 30 is a circuit diagram showing a part of a direct peripheral circuit for DRAM in a further embodiment of this invention.

FIG. 30 shows a circuit that selectively picks up the read data amplified by the segment bit lines (SBL, $\overline{SBL}$) or the global bit lines (GBL, $\overline{GBL}$) at the common data lines (CDL, $\overline{CDL}$) according to the specified address by the column decoder. The read circuit is a direct type sense amplifier that is activated by holding the read signal high and the write circuit is activated by holding the write signal high.

The above circuit is constructed of only the n-channel MISFET and thus it is possible to reduce the effective area of the circuit by connecting the n-channel MISFET and the common data lines (CDL, $\overline{CDL}$) through the pad layer which is made of the same conductive layer as the storage node of the memory cell MC.

Embodiment 4

Figure 31:
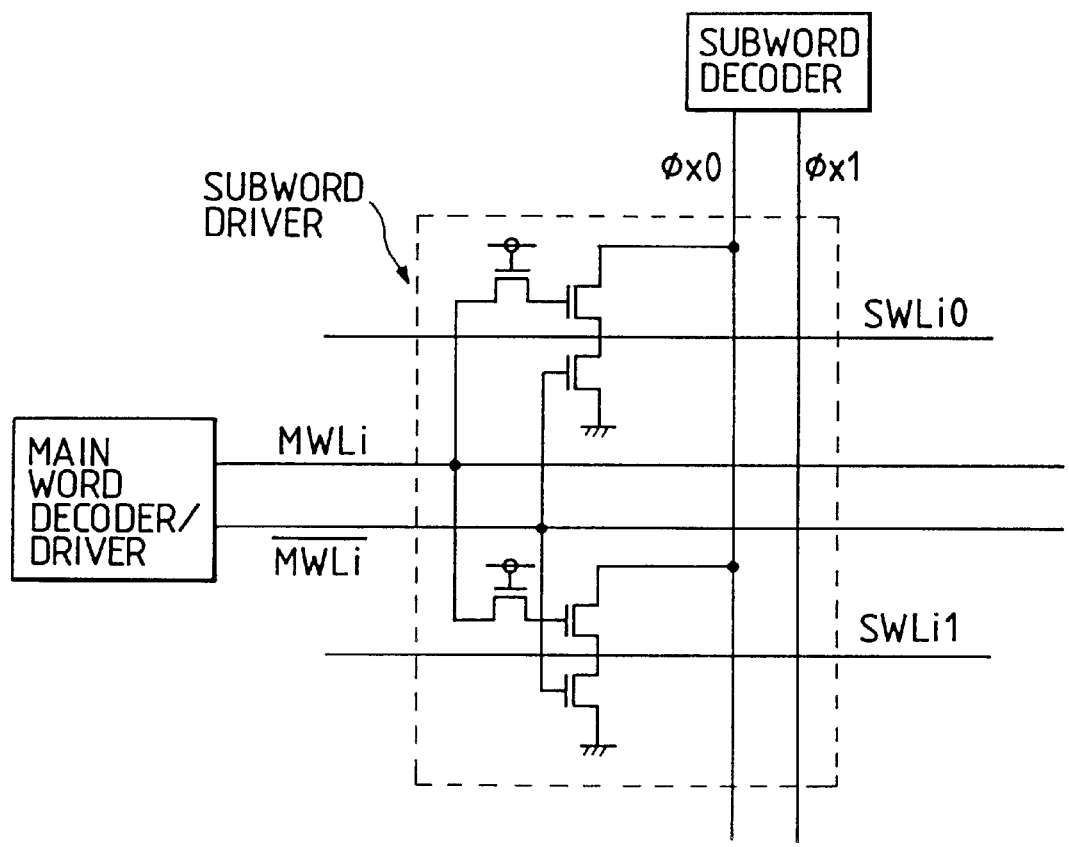
FIG. 31 is a circuit diagram of a further embodiment of this invention showing a part of a DRAM memory array and of a direct peripheral circuit.

FIG. 31 is a circuit diagram of this embodiment showing a part of the DRAM memory array and of the direct peripheral circuit (subword driver).

The n-channel MISFET forming the subword driver is connected through address selection lines ($\phi x0$, $\phi x1$) to a subword decoder and through main word lines (MWLi, $\overline{MWLi}$) to a main word decoder. Selection of a subword line (SWLi) is made by holding a main word line (MWLi) high and a main word line ($\overline{MWLi}$) low and holding one ($\phi x0$) of the subword lines ($\phi x0$, $\phi 1$) high.

Application of the aforementioned pad layer to the n-channel MISFET that forms the subword driver reduces its effective area.

Embodiment 5

Figure 32:
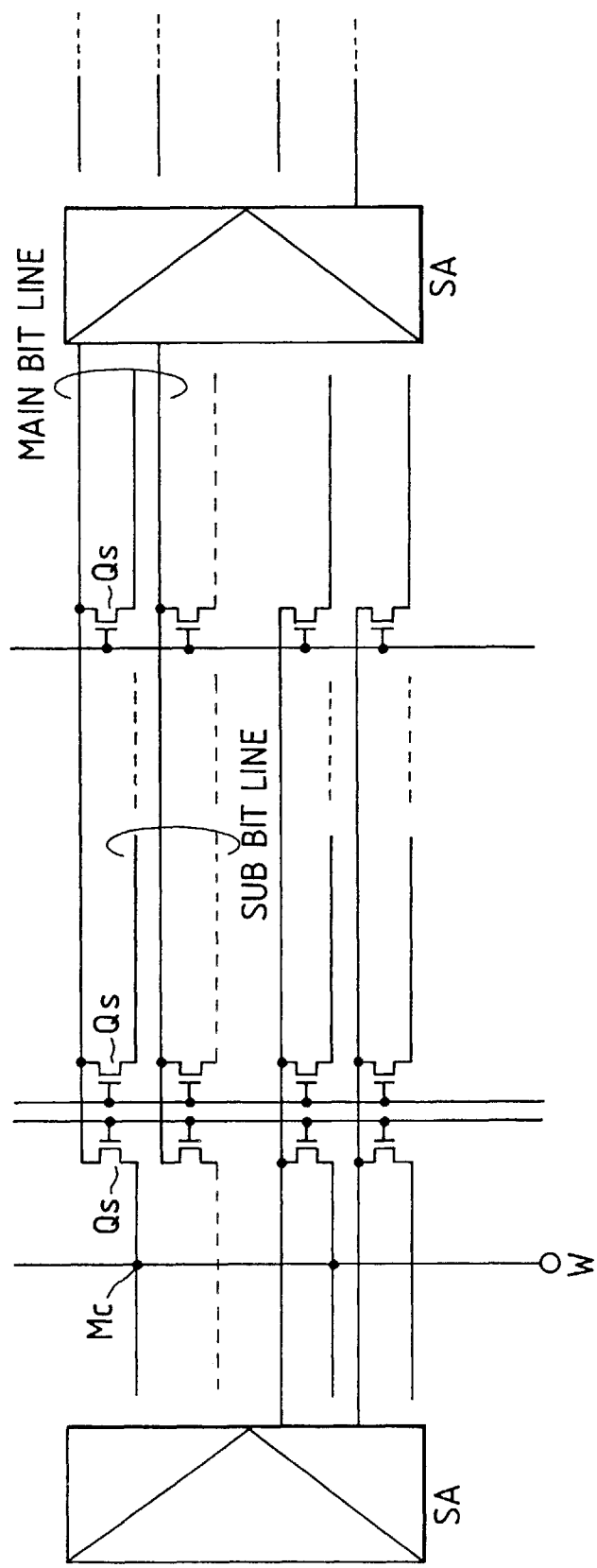
FIG. 32 is a circuit diagram showing a part of a direct peripheral circuit for DRAM in a further embodiment of this invention.

FIG. 32 is a circuit diagram showing a part of the direct peripheral circuit for the DRAM in this embodiment.

To reduce the delay time and power consumption of the bit line, the DRAM of this embodiment has the bit line divided into a main bit line and a sub-bit line arranged in hierarchical configuration, the main bit line connected to the sense amplifier SA and the sub-bit line to the memory cell.

The main bit line is formed of the fifth conductive film (a three-layer film consisting of TiW film, aluminum alloy film, and TiW film), while the sub-bit line is formed of the second conductive film (polysilicon film). The main bit line and the sub-bit line are connected through a switch n-channel MISFET Qs.

By applying the pad layer to the connection between the switch n-channel MISFET Qs and the main bit line and by forming the switch n-channel MISFET Qs in almost the same geometry and dimension as the memory cell selection MISFET Qt, it is possible to reduce the effective area of the switch n-channel MISFET Qs. In this case, one switch can be formed in an area almost equal to one bit of memory cell.

Figure 33:
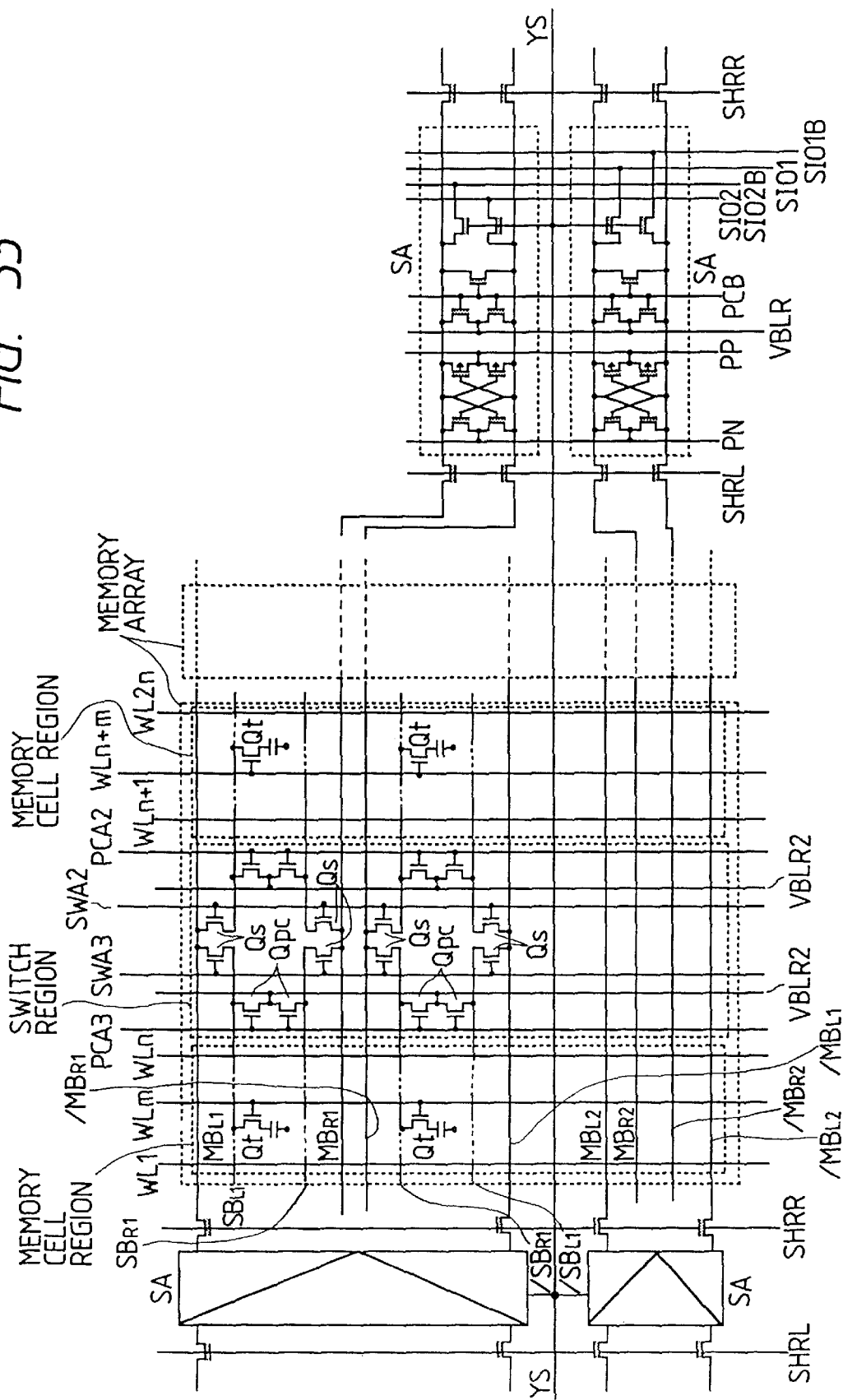
FIG. 33 is a circuit diagram showing a variation of the hierarchical bit line system shown in FIG. 32.

FIG. 33 shows an example, in which the bit lines, as in the case of FIG. 32, are divided into the main bit lines connected to the sense amplifier SA and the sub-bit lines SB directly connected to the memory cells MC and configured in a hierarchical structure (hereinafter referred to as a hierarchical bit line configuration). The circuit of FIG. 33 has a precharge circuit added to the sub-bit line SB of FIG. 32.

Designated $MB_{L1}$, $\overline{MB_{L1}}$, $MB_{R1}$, $\overline{MB_{R1}}$, . . . are main bit lines; and $SB_{L1}$, $\overline{SB_{L1}}$, $SB_{R1}$, $\overline{SB_{R1}}$, . . . sub-bit lines. The sub-bit line selection signals (SWA2 and SWA3) control the gate of the sub-bit line selection MISFET Qs, which connect.s the sub-bit line and the main bit line, to connect a sub-bit line pair (for example, $SB_{L1}$, $\overline{SB_{L1}}$) to the main bit lines (for example, $MB_{L1}$, $\overline{MB_{L1}}$). Denoted VBLR2 is a bit line precharge voltage (a potential almost halfway between high level and low level of the bit line)) supply line. The precharge circuit comprises a sub-bit line precharge MISFET Qpc connected between the sub-bit line and the bit line precharge voltage supply line VBLR2. The gate of the MISFET Qpc is connected with sub-bit line precharge signal lines PCA2, PCA3.

As shown in FIG. 33, two memory arrays are disposed between two sense amplifiers SA arranged in the same direction that the main bit lines MB extend. The memory array includes a memory cell region in which a plurality of memory cells are arranged in matrix and a switch region in which the sub-bit line selection MISFET Qs and the sub-bit line precharge MISFET Qpc are located. One of the four sub-bit lines SB located between the two sense amplifiers SA is connected to the main bit line MB.

The feature of this configuration is that because a control can be performed to disconnect all the sub-bit lines SB from the main bit line MB during the main bit line precharging, only one switch signal such as the sub-bit line selection signal SWA2 need be activated to connect only the sub-bit line SB selected during the operation to the main bit line MB. This reduces power consumption.

The sense amplifiers SA are connected to a pair of main bit lines MB and arranged one on each side of the memory array. That is, one sense amplifier need to be installed in a space corresponding to four main bit lines MB, alleviating the layout pitch of the sense amplifiers SA.

Figure 34:
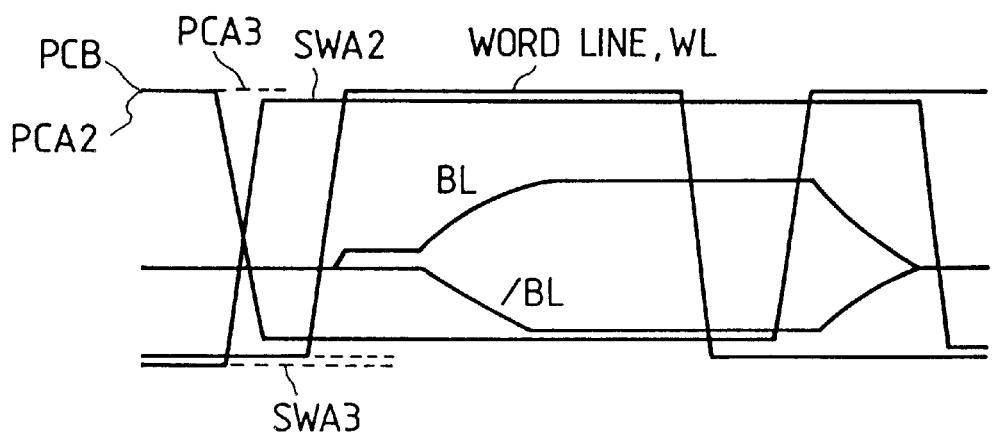
FIG. 34 is a timing chart showing the operation of the circuit of FIG. 33.

FIG. 34 is an operation waveform diagram for the circuit of FIG. 33. Denoted PCB is a precharge signal for the main bit line MB, and WL a word line. Signals corresponding to deselection sub-bit lines are shown as a dotted line. The precharge signal for main bit line MB and the precharge signal for sub-bit line (for example, PCA2) change from high level to low level; at the end of the precharging of the main bit line MB and sub-bit line SB, the sub-bit line selection signal (say, SWA2) goes high, followed by the rising of the word line (WL), causing the read signal voltage (represented as BL, $\overline{BL}$ in FIG. 34) to appear on the sub-bit line SB and the main bit line MB. The read signal voltage is amplified by the sense amplifier SA and read out through input/output lines (SIO1, SIO1B, S1O2, S1O2B).

Upon completion of the readout operation, the word line WL goes low and the precharge signals (PCB and PCA2) go high, shorting the main bit line MB and the sub-bit line SB to the precharge voltage. Finally, the sub-bit line selection signal SWA goes low, disconnecting the sub-bit line SB from the main bit line MB.

Figure 35:
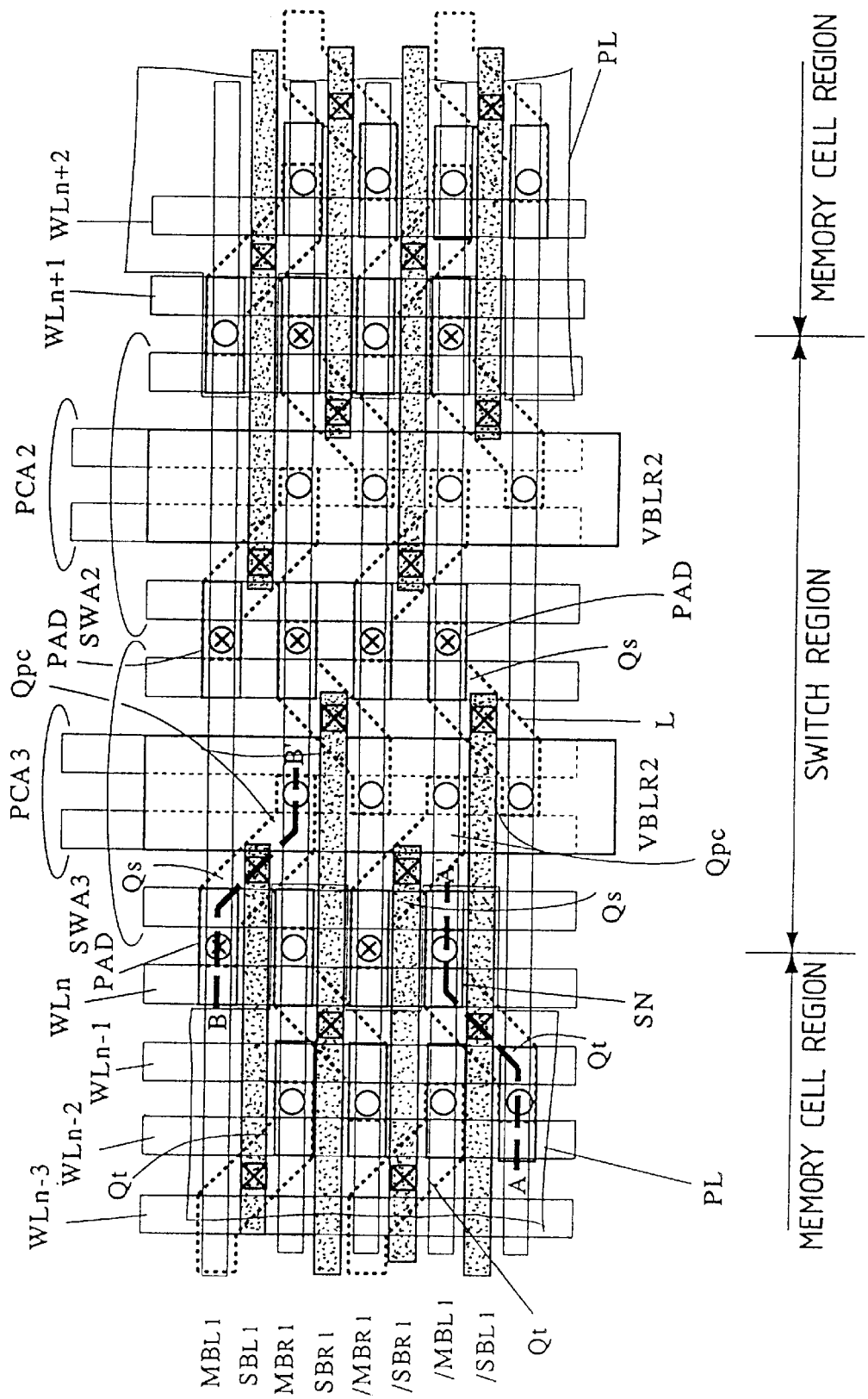
FIG. 35 is a plan view showing the layout of a DRAM memory cell region and a switch region.

FIG. 35 shows the layout of the hierarchical bit line configuration of FIG. 33. There are a memory cell region in which a plurality of memory cells MC are arranged in matrix, and a switch region located between the memory cell regions where the sub-bit line selection MISFETs Qs and the sub-bit line precharge MISFETs Qpc are formed. This switch region is arranged in an area of eight word lines.

In the memory cell region, the plurality of word lines WL are arranged in specified pitches in the column direction and extend in the row direction. In the switch region, interconnections (such as SWA3, PCA3) formed of the same layer as the word lines WL are arranged in the same pitches and have the same widths as those of the word lines. That is, the word lines WL and interconnections SWA3, PCA, . . . formed of the first conductive film have equal line widths and equal pitches over the memory cell regions and the switch region.

An active region inside a thick broken line L is enclosed by the field insulation film 3. In the active region, areas other than below the word lines are formed as an n type semiconductor region. This means that the n type semiconductor region is formed in self-aligned with respect to the word lines WL. This active region extends in an inclined direction crossing the column and row directions and beyond the adjacent two word line pairs. The direction in which the active region extends is parallel to a particular word line pair (for instance, WLn and WLn-1) but reverse with respect to a word line pair (WLn-2 and WLn-3) adjacent to that particular word line pair.

In a region between the particular paired word lines, the semiconductor area in the active region is connected to the sub-bit line SB and, in the region outside the word Lines, is connected to the storage node SN.

The regularity of the direction in which the active region extends also applies to the switch region.

The sub-bit line selection MISFET Qs and the sub-bit line precharge MISFET Qpc have the same structure as the memory cell selection MISFET Qt. In the switch region, the shape of the field insulation film 3 and the active region is totally equal to the shape of the field insulation film 3 and the active region in the memory cell area. Further, the sub-bit line precharge signal interconnections PCA2, PCA3 and the sub-bit line selection signal interconnections SWA2, SWA3 are formed of a material (first conductive film) of the same layer as the gate electrode of the memory cell selection MISFET Qt and have the same line width and pitch as the word lines forming the gate electrodes. With the same pattern repeated in the memory cell region and in the switch region, the exposing technique using the phase shift method becomes easy to apply, permitting fine processing of the semiconductor material.

In FIG. 35, an area inside the thick broken line L is an active region and an outside area is where the field insulation film 3 is formed. The word lines WL of memory cell, the sub-bit line precharge signal interconnections PCA2, PCA3 and the sub-bit line selection signal interconnection SWA2, SWA3 are formed of the first conductive film of polysilicon. The first conductive film may be formed as a polycide structure in which a refractory metal silicide layer is deposited on the polysilicon film.

The sub-bit lines $SB_{L1}$, $SB_{R1}$, $\overline{SB_{R1}}$, . . . extend in a direction perpendicular to the word lines WL and are constructed of a polycide film, the second conductive film. The storage node SN of the memory cell is constructed of the third conductive film, and in the switch region, the bit line precharge voltage supply line VBLR2 is formed of the third conductive film. Connection between the sub-bit line selection MISFET Qs and the main bit lines $MB_{L1}$, $\overline{MB_{L1}}$ is made through a pad layer PAD of the third conductive film.

In the memory cell region, a plate electrode PL is formed to cover the storage node SN. In this layout, the plate electrode PL is not located over the sub-bit line precharge MISFET Qpc and sub-bit line selection MISFET Qs. A dielectric film 18 is formed between the storage node SN and the plate electrode PL. The storage node SN, the plate electrode PL and the dielectric film together constitute the capacitor of the memory cell.

The man bit lines $MB_{L1}$, $\overline{MB_{L1}}$, . . . extend in the same direction as the sub-bit lines $SB_{L1}$, $SB_{R1}$, . . . and formed of the fifth conductive film.

Figure 36A:
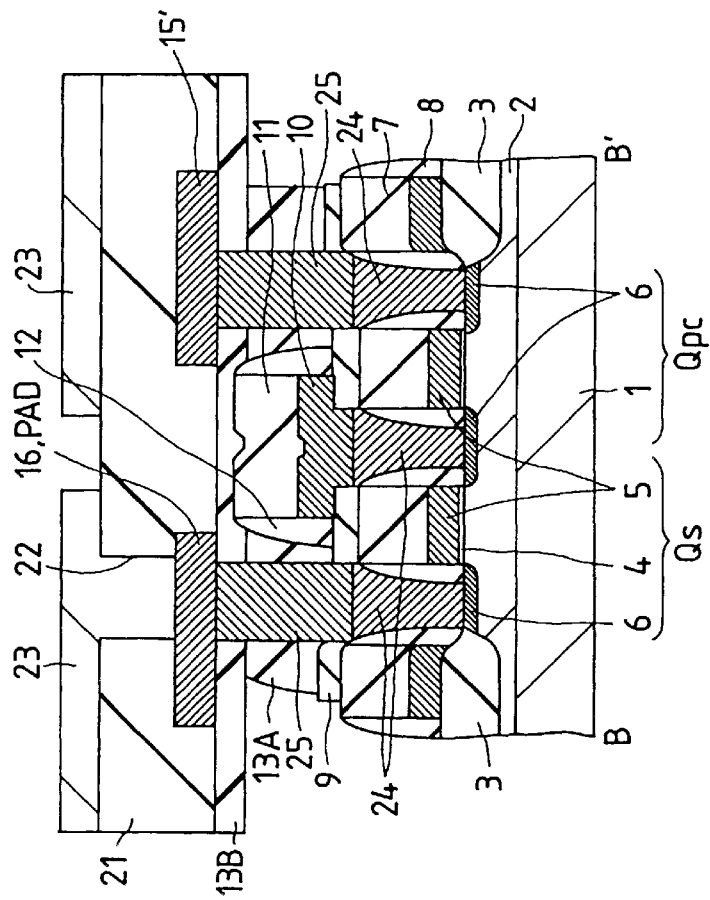
FIG. 36A is a cross section taken along the line A–A' of FIG. 35.
Figure 36B:
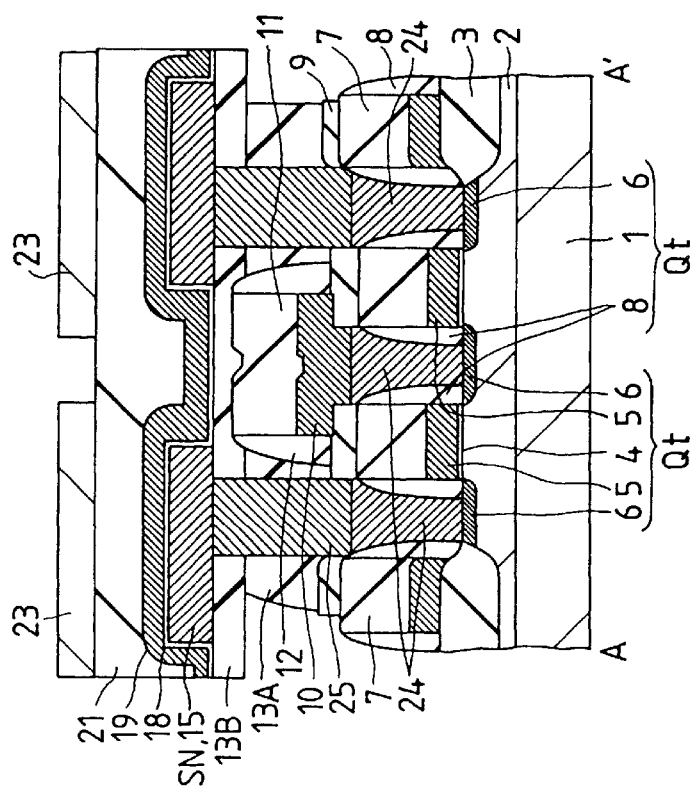
FIG. 36B is a cross section taken along the line B–B' of FIG. 35.

FIGS. 36A and 36B show cross sections of the memory cell of FIG. 35 (cross section taken along the line A–A') and of the sub-bit line selection MISFET Qs and sub-bit line precharge MISFET Qpc (cross section taken along the line B–B'). The same layers as the memory cell shown in FIG. 2 are assigned the like reference numerals. The points in which this memory cell differs from the memory cell of FIG. 2 are that the sub-bit line 10 is connected to the semiconductor region 6 through the first plug electrode 24 of polysilicon; that the storage node SN, 15 of the capacitor is connected to the semiconductor region 6 through the first and second plug electrodes 24, 25; and that the fifth conductive film 23 is used not as the second word line but as the main bit line MB.

In FIGS. 36A and 36B, those parts given the same reference numbers as the corresponding parts in FIG. 2 have the similar materials and manufacturing method, and therefore their explanations are omitted.

In FIG. 36A, the sub-bit line 10, SB corresponds to the bit line of FIG. 2 and is connected to the semiconductor region 6 through the first plug electrode 24 made of polysilicon film. The first plug electrode 24 is formed by depositing a polysilicon film between the word lines WL1, WL2, . . . which are formed integral with the gate electrode 4, and etching back the polysilicon film to leave it between the word lines WL1, WL2, . . .

The storage node SN, 15 is formed over the interlayer insulation film 13, which consists of a BPSG film 13A reflowed at about 800° C. to planarize its surface and a $SiO_2$ film 13B deposited over the planarized BPSG film 13A. The storage node SN, 15 is connected to the semiconductor region 6 through the first and second plug electrodes 24, 25. The first plug electrode 24 is produced during the same process that forms the first plug electrode 24 below the sub-bit line 10, SB. The interlayer insulation film 13 is formed with through-holes and then a polysilicon film is deposited and etched back to form the second plug electrode 25 only in the through-hole.

The main bit line 23, MB formed of the fifth conductive film is constructed in a three-layer film structure consisting of a barrier metal film, an aluminum alloy film and a barrier metal film. The barrier metal film may, for example, be a TiW film, and the aluminum alloy film may be an aluminum film added with Cu and Si.

FIG. 36B shows the sub-bit line selection MISFET Qs (at left) and the sub-bit line precharge MISFET Qpc (at right). The sub-bit line selection MISFET Qs and the sub-bit line precharge MISFET Qpc have the same channel length and channel width as those of the memory cell selection MISFET Qt. They also have the same gate material. One of the semiconductor regions 6 of the sub-bit line selection MISFET Qs is connected with a sub-bit line 10 through the first plug electrode 24. The other semiconductor region 6 is connected with a main bit line 23 through the first and second plug electrodes 24, 25 and through the pad layer 16, PAD which is formed of the same layer as the storage node 15.

One of the semiconductor regions 6 of the sub-bit line precharge MISFET Qpc is formed integral with one of the semiconductor regions 6 of the sub-bit line selection MISFET Qs. The other semiconductor region 6 is connected to the bit line precharge voltage supply line VBLR2 through the first and second plug electrodes 24, 25. The bit line precharge voltage supply line VBLR2 is formed of the same third conductive film as the storage node SN, 15 and, as show in FIG. 35, is provided in an area which is located over, and equal in size to, the two sub-bit line precharge signal lines PCA2, PCA3.

As is apparent from FIG. 35, the sub-bit line selection MISFET Qs and the sub-bit line precharge MISFET Qpc are formed using the active region of the same shape as the active region of the memory cell selection MISFET Qt and have their gate electrodes formed of the first conductive film arranged in the same pitch as the word lines in the memory cell. Therefore, it is possible to arrange the sub-bit line selection MISFET Qs and the sub-bit line precharge MISFET Qpc without changing the pitch of the sub-bit line SB and the main bit line MB in the direction in which the word lines extend.

As is seen from FIG. 36A and 36B, because the second semiconductor region 6 of the sub-bit line selection MISFET Qs is connected to the main bit line 23 through the first and second plug electrodes 24, 25 and through the pad layer 16, PAD and because the bit line precharge voltage supply line VBLR2 connected to the second semiconductor region 6 of the sub-bit line precharge MISFET Qpc is formed using the third conductive film 15', the switch region can be made to have an altitude almost equal to that of the memory cell region. This eliminates the need to provide a step buffer zone between the memory cell region and the switch region, thereby improving the circuit density.

Figure 37:
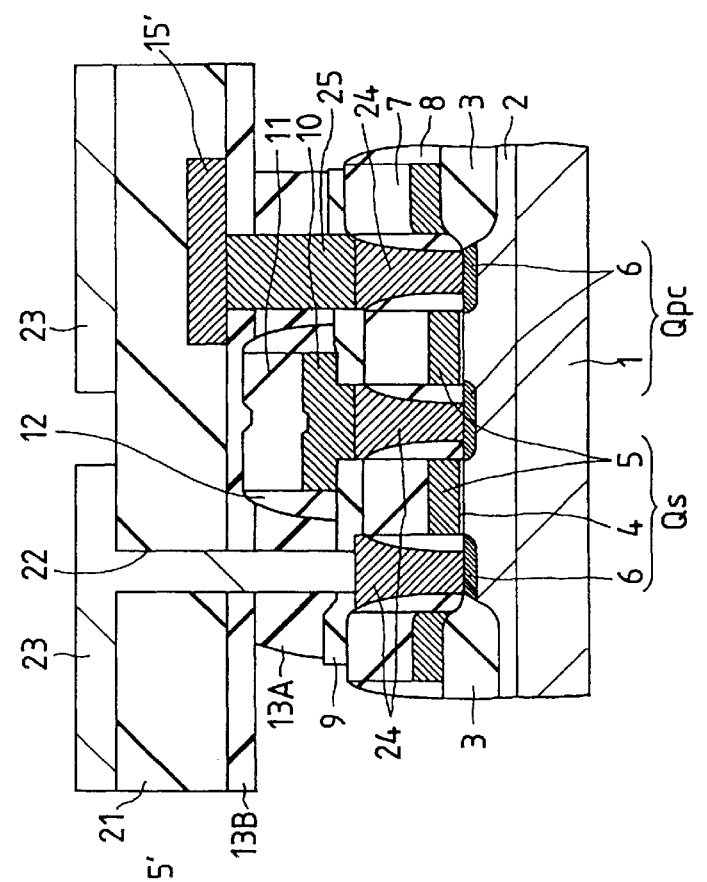
FIGS. 37 and 38 are cross sections showing variations of the cross-sectional structure of a sub-bit line selection MISFET shown in FIG. 36B.

FIG. 37 shows a variation of the sub-bit line selection MISFET Qs of FIG. 36B. In contrast to FIG. 36B, the semiconductor region 6 and the main bit line MB, 23 in FIG. 37 are interconnected through the first and second plug electrodes 24, 25 without using the pad layer 16, PAD which is the same layer as the storage node 15, SN.

Figure 38:
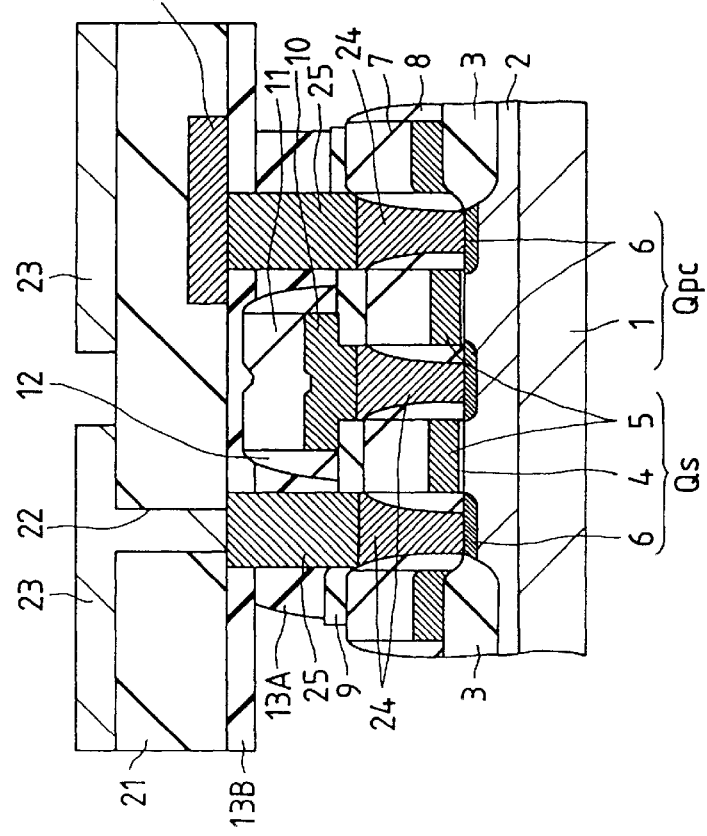

FIG. 38 shows a variation of the sub-bit line selection MISFET Qs of FIG. 36B. In contrast to FIG. 36B, the semiconductor region 6 and the main bit line MB, 23 in FIG. 38 are interconnected through the first plug electrode 24 without using the second plug electrode 25 nor the pad layer 16, PAD which is the same layer as the storage node 15, SN. In the case of FIGS. 37 and 38, it is required that the diameter of the through-hole formed in the interlayer insulation films 21, 13 be smaller than the plan view area of the plug electrode. This is to provide an alignment margin between the through-hole and the plug electrode.

In FIGS. 36B, 37 and 38, the structure in which the plug electrodes 24, 25 or the pad layer 16, PAD are interposed between the semiconductor region 6 and the fifth conductive film 23 forming the main bit line MB makes it possible to reduce the aspect ratio of the through-hole formed in the insulation film underlying the fifth conductive film 23. Therefore, because there is no need to provide a step buffer zone between the memory cell region and the switch region, the circuit density can be enhanced.

Figure 39A:
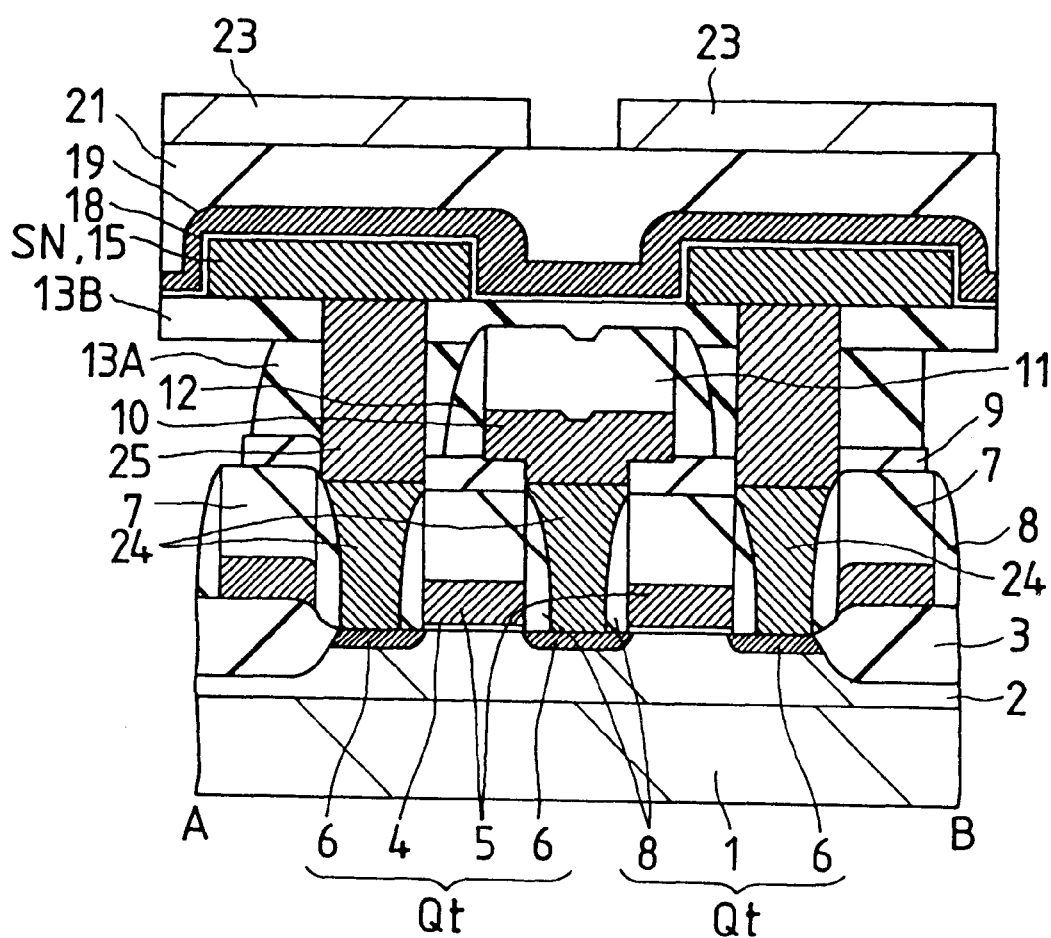
FIGS. 39A and 39B are examples, in which the memory cell region and the switch region are formed in a recess region of the semiconductor substrate and in which the indirect peripheral circuit area is formed in a region of the substrate other than the recess region.
Figure 39B:
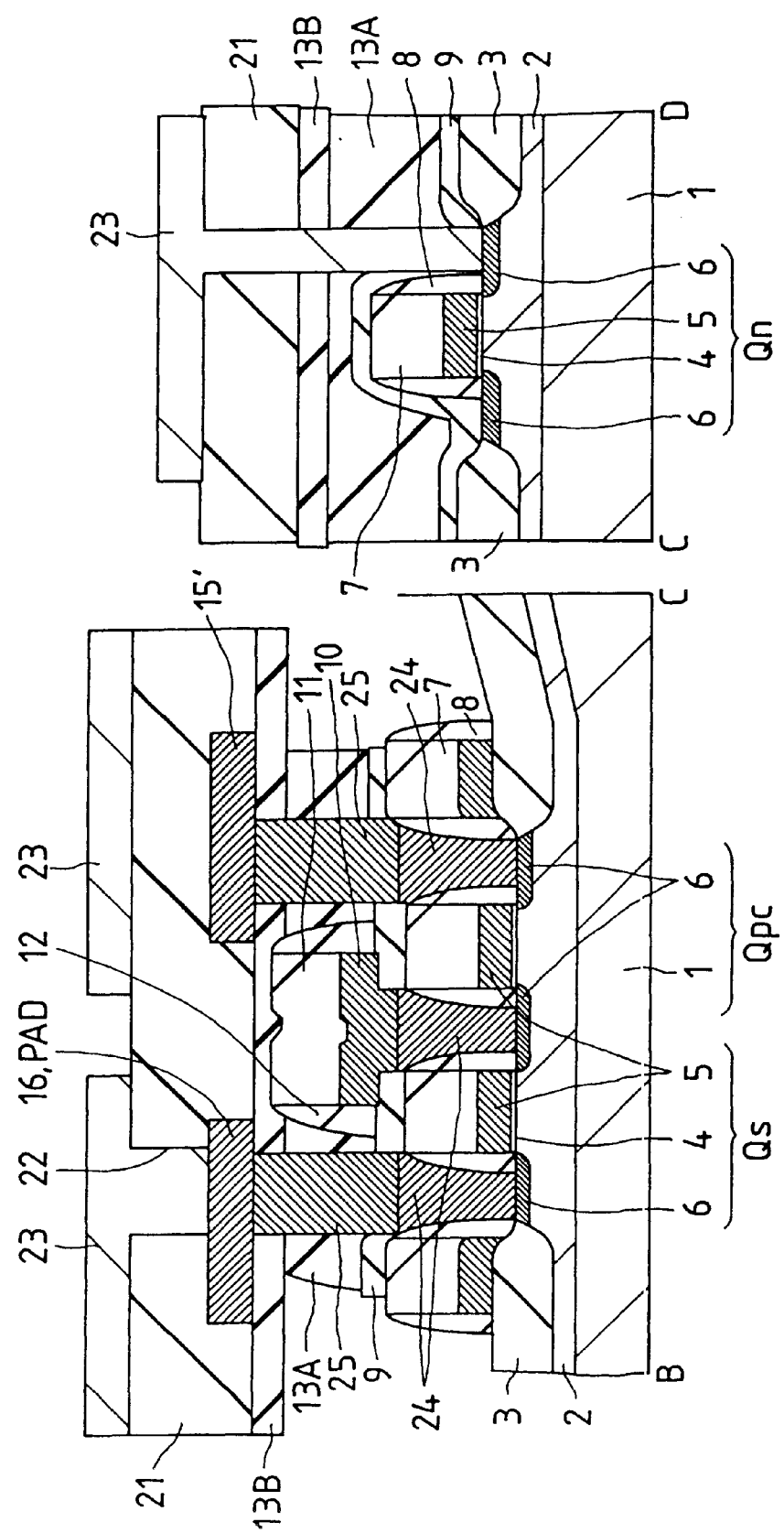

FIG. 39A and 39B show an example application of a recess array structure to this invention. The recess array structure is a technique whereby a DRAM memory cell portion is formed in a low altitude area (recess region) of the semiconductor substrate with a peripheral circuit portion formed in a high altitude area to improve the processing accuracy of interconnections that span from the memory cell region to the peripheral circuit region. This technique is disclosed in U.S. Pat. No. 5,196,910, for example. In the U.S. Pat. No. 5,196,910, the memory cells are formed in the recess area and all the MIISFETs forming the peripheral circuits are located in high altitude area other than the recess area.

In the example shown in FIG. 39A and 39B, the memory cell Qt (A-B portion), the sub-bit line selection MISFET Qs and the sub-bit line precharge MISFET Qpc (B-C portion) are formed in the low altitude area (recess region) of the semiconductor substrate 1, and the MISFETs Qn (C-D portion) that form the peripheral circuit (other than the sub-bit line selection MISFET Qs and sub-bit line precharge MISFET Qpc) are formed in the high altitude area of the substrate 1.

That is, by using the plug electrodes 24, 25 and the pad layer 16, PAD in connecting the sub-bit line selection MISFET Qs and the main bit line MB and by forming the bit line precharge voltage supply line VBLR2—which is connected to the sub-bit line precharge MISFET Qpc—using the same third conductive film as the storage node 15, SN, it is possible to form the sub-bit line selection MISFET Qs and the sub-bit line precharge MISFET Qpc in the recess area. This is because the altitudes of the memory cell region and the switch region become almost equal during the fifth conductive film forming process. Therefore, when compared with a case where the sub-bit line selection MISFET Qs and the sub-bit line precharge MISFET Qpc are formed in the high altitude region of the semiconductor substrate, this method can realize a higher circuit density. In forming the recess region, the method disclosed in the U.S. Pat No. 5,196,910 may be used.

Figure 40:
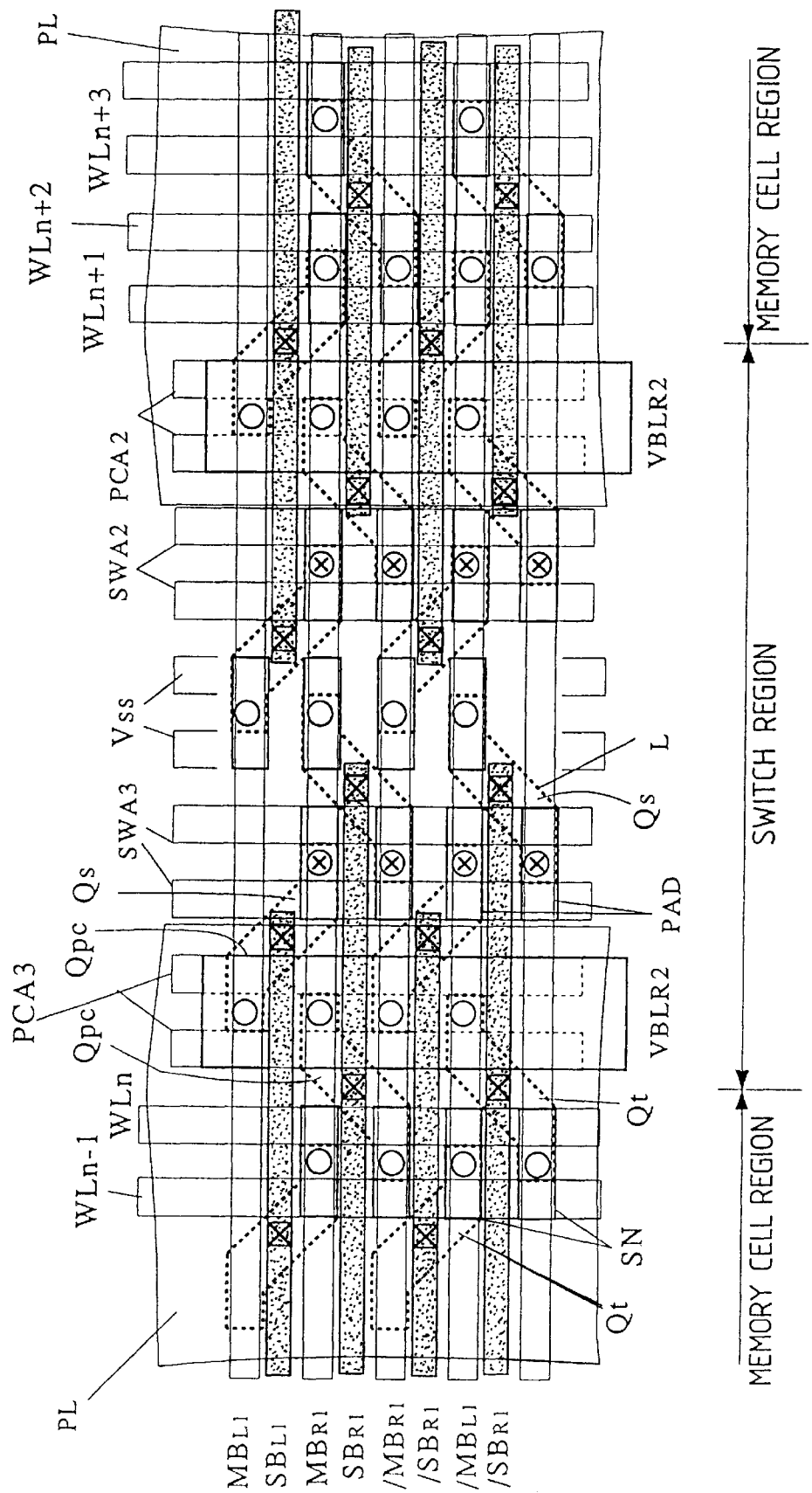
FIGS. 40 and 41 are plan views showing variations of the layout of FIG. 35.

FIG. 40 shows a variation of layout of the sub-bit line selection MISFET Qs and the sub-bit line precharge MISFET Qpc shown in FIG. 35. In FIG. 40, an area equal in size to 10 interconnections formed of the same first conductive film as the word line is allocated as the switch region. The structure of FIG. 40 is characterized in that the storage node SN and the pad layer PAD do not adjoin each other in the direction in which the word line extends. When, as shown in FIG. 35, the storage node SN and the pad layer PAD adjoin each other at the boundary between the memory cell region and the switch region, it is necessary to pattern the plate electrode PL between them, which in turn requires a high processing precision. The structure of FIG. 40, on the other hand, makes the processing easy.

Figure 41:
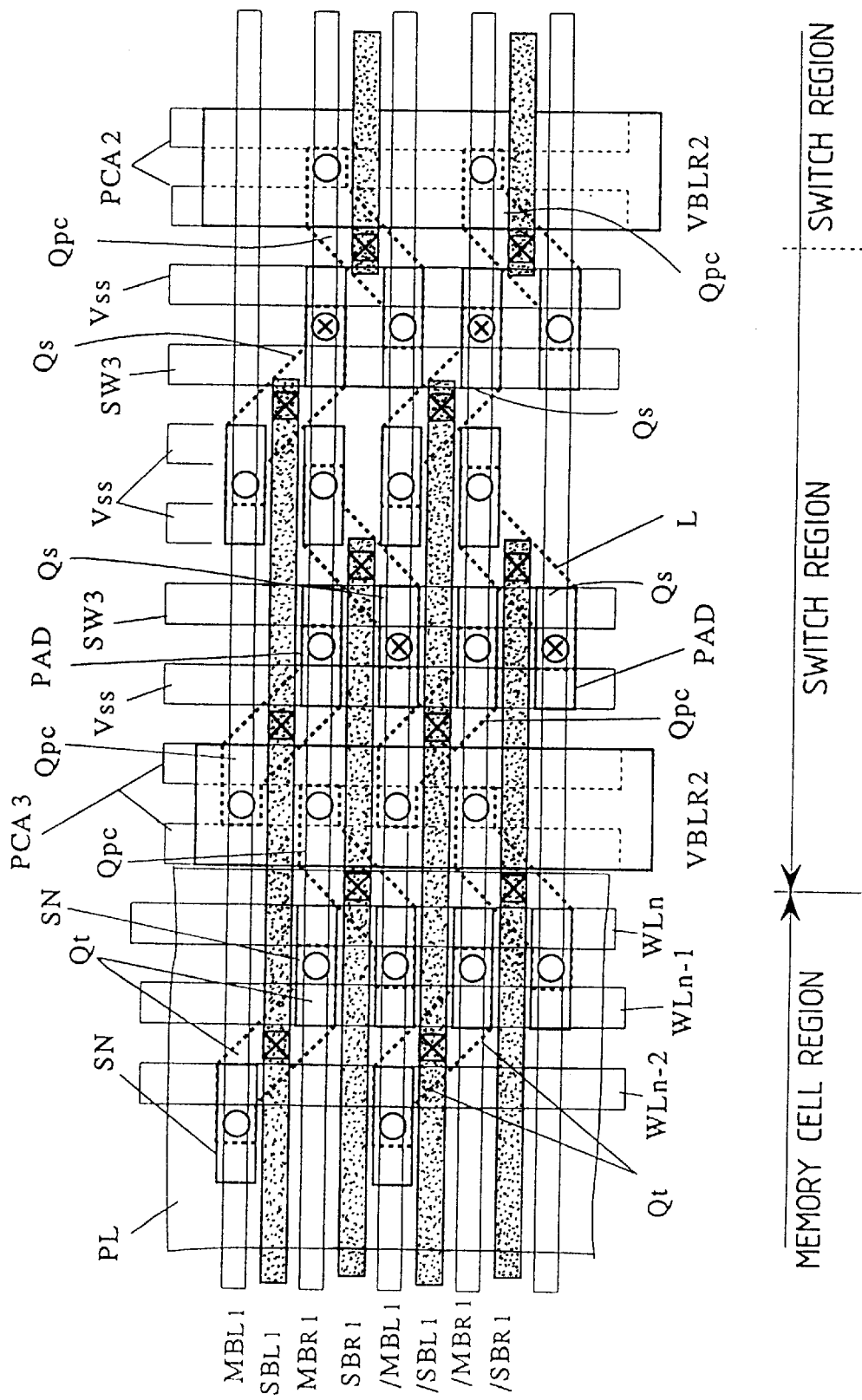

FIG. 41 shows a variation of layout of the sub-bit line selection MISFET Qs and the sub-bit line precharge MISFET Qpc shown in FIG. 35. In this example, an area equal in size to 16 interconnections formed of the same first conductive film as the word line is allocated as the switch region. FIG. 41 shows only one-half of the region. The pattern ranging from PCA3 to Vss on the right side of SW3 is repeated starting from the PCA2 portion.

This example has a construction in which the contact hole (22 in FIG. 36B) between the main bit line MB and the pad layer PAD does not adjoin another contact hole of the adjacent main bit line MB. Such a layout allows that portion of the main bit line MB which is located in the contact hole between the main bit line MB and the pad layer PAD to have a dog-bone structure. The dog-bone structure is a technique whereby only the contact portion of the main bit line MB is increased in width to secure an alignment margin between the contact hole 22 and the main bit line MB. By shifting from each other the positions of the main bit line-pad layer contact holes of the adjacent main bit lines MB, there is no need to widen the pitch of the main bit lines MB even when the dog-bone structure is employed. Although FIG. 41 does not show the dog-bone structure, actually the dog-bone structure is applied to the main bit lines MB.

Figure 42:
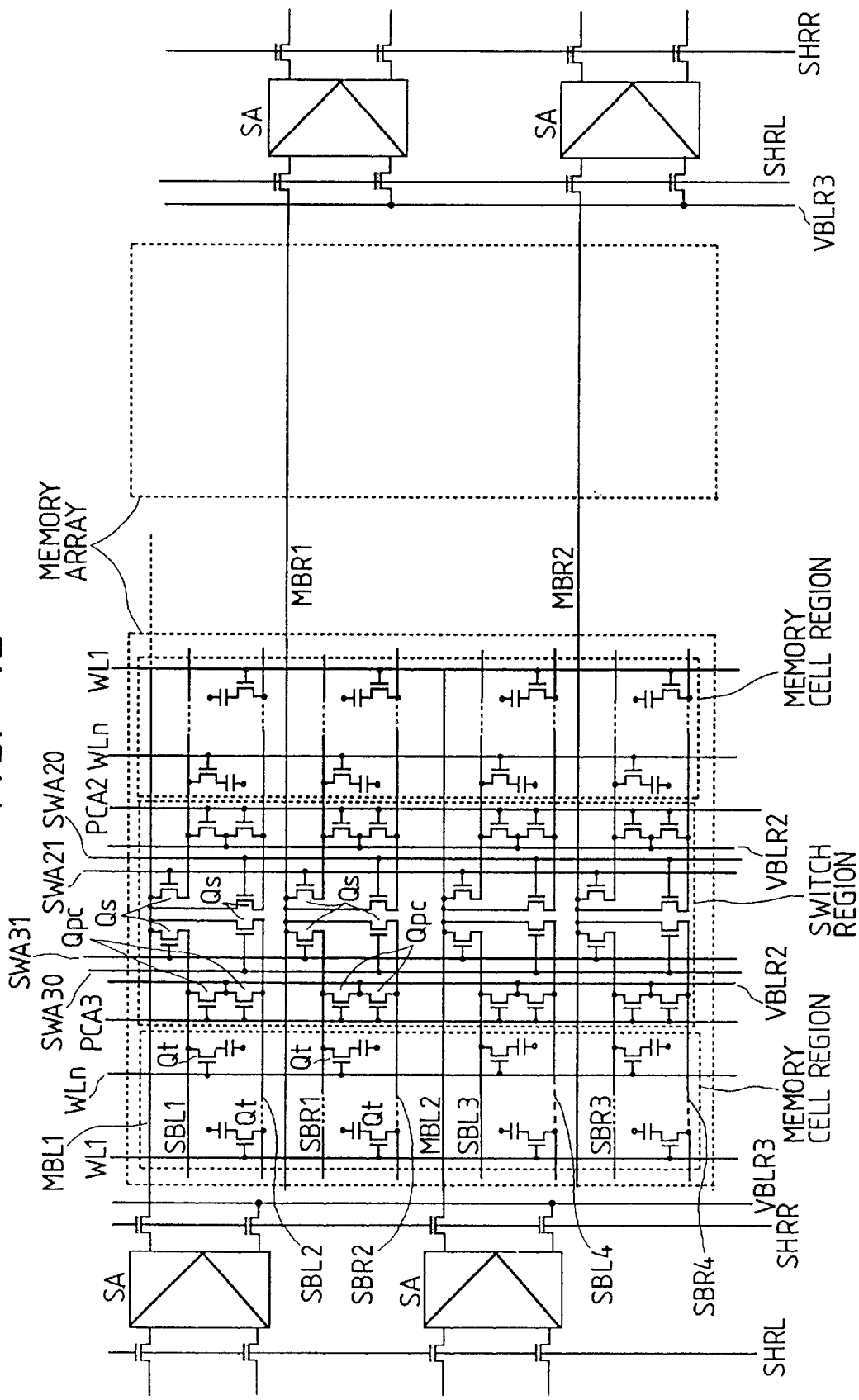
FIG. 42 is a circuit diagram showing a variation of the layered bit line system shown in FIG. 33.

FIG. 42 shows a circuitry of another embodiment of the hierarchical bit line configuration. In this circuit diagram, the main bit line MB is not formed as a complementary one, but only one of the two main bit lines connected to the sense amplifier SA is connected with a plurality of sub-bit lines SB while the other main bit line is supplied with a reference voltage VBLR3 (for example, a potential almost midway between the high level and the low level of the bit line and equal to the precharge voltage for the main bit line and sub-bit line).

In one memory cell, the first main bit line is connected with four sub-bit lines SB through the sub-bit line selection MISFET Qs. The sub-bit line precharge MISFET Qpc is connected between each sub-bit line SB and the sub-bit line precharge voltage supply line VBLR2.

Figure 43:
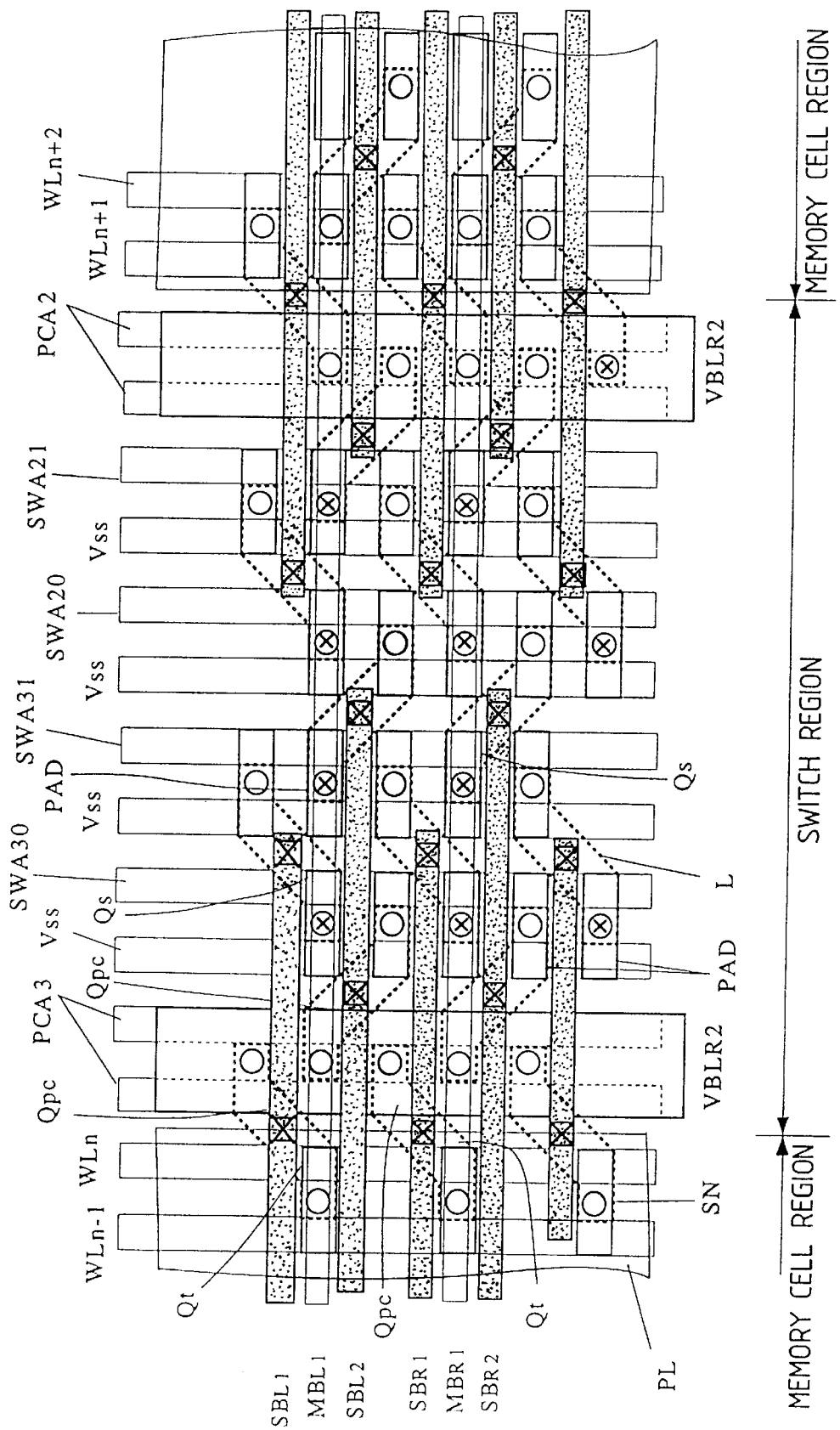
FIG. 43 is a plan view showing the layout of the DRAM memory cell region and the switch region shown in FIG. 42.

FIG. 43 shows the circuit layout of FIG. 42. The switch region is located between the memory cell regions and is laid out in an area equal in size to 12 interconnections formed of the same first conductive film as the word line. The example structure shown in FIG. 42 and 43 allows the pitch of the main bit lines MB to be increased to two times that of the sub-bit lines SB. This in turn increases the process margin of the main bit lines MB, improving the yield and enhancing the level of circuit integration.

In the examples shown in FIGS. 40 through 43, the memory cell MC has the same structure as shown in FIG. 36A, and the sub-bit line selection MISFET Qs and the sub-bit line precharge MISFET Qpc have the same structure as shown in FIGS. 36B, 37B or 38. The structures shown in FIGS. 40 to 43 can apply the recess array structure shown in FIG. 39A and 39B.

This invention has been described in conjunction with the embodiments. It is noted that the invention is not restricted to these embodiments and that various modifications may be made without departing from the spirit of this invention.

Some representative advantages of this invention may be briefly summarized as follows.

This invention makes it possible to reduce the aspect ratio of the contact hole that connects the transistor in the direct peripheral circuit and the interconnections formed of the fifth conductive film, thus improving the processing accuracy of the contact hole and the connection reliability of the interconnections in the contact hole. This obviates the need to provide a step buffer zone between the memory cell and the direct peripheral circuit.

Further, the MISFET that forms the direct peripheral circuit can be formed in almost the same shape and dimension as the memory cell selection MISFET. It is also possible to form the pad layer in almost the same shape and dimension as the storage node of the capacitor in memory cell.

Because these features combine to reduce the effective area occupied by the direct peripheral circuit, the area of the semiconductor chip can be reduced, increasing the number of chips manufactured per unit wafer.

We claim:

1. A method of fabricating a semiconductor integrated circuit device having word lines, data lines, memory cells each connected to one of said word lines and one of said data lines and a peripheral circuit, and each of said memory cells including a first MISFET and a capacitor element and the peripheral circuit including a second MISFET, comprising the steps of:

preparing a semiconductor substrate having a main surface including a first portion for the memory cells and a second portion for the peripheral circuit;

forming a first conductive layer over said main surface of said semiconductor substrate and forming a first conductive strip serving as a gate electrode of said first MISFET and one of said word lines in said first portion of said semiconductor substrate by etching said first conductive layer, and forming a second conductive strip serving as a gate electrode of said second MISFET in said second portion of said semiconductor substrate by etching said first conductive layer;

forming a first semiconductor region and a second semiconductor region in said first portion of said semiconductor substrate, said first and second semiconductor regions being self-aligned with said first conductive strip;

forming a first insulating film over said first and second conductive strips, said first insulating film having a first contact hole on said first semiconductor region and a second contact hole on said second conductive strip;

forming a second conductive layer over said first insulating film and forming a third conductive strip serving as one of said data lines in said first portion by etching said second conductive layer and a fourth conductive strip in said second portion by etching said second conductive layer;

forming a second insulating film over said third and fourth conductive strips;

forming a third conductive layer over said second insulating film and forming a first electrode of said capacitor element in said first portion of said semiconductor substrate by etching said third conductive layer; and forming a fourth conductive layer over said first electrode and forming a second electrode of said capacitor element in said first portion of said semiconductor substrate by etching said fourth conductive layer, wherein said third conductive strip is electrically connected to said first semiconductor region via said first contact hole, wherein said fourth conductive strip is electrically connected to said second conductive strip via said second contact hole, and wherein a fifth conductive strip is electrically connected to said second semiconductor region.

2. A method of fabricating a semiconductor integrated circuit device according to claim 1, further comprising the steps of:

forming a third insulating film over a sixth conductive strip in said first portion and over said second insulating film in said second portion, and said third insulating film having a third contact hole on said fourth conductive strip; and forming a fifth conductive layer over said third insulating film and forming a seventh conductive strip in said second portion by etching said fifth conductive layer, wherein said seventh conductive strip is electrically connected to said fourth conductive strip.

3. A method of fabricating a semiconductor integrated circuit device according to claim 2, wherein said step of forming a third insulating film comprises the substeps of:

forming a silicon oxide film over said sixth conductive strip in said first portion and over said second insulating film in said second portion;

forming a BPSG film over said silicon oxide film; and annealing said BPSG film so as to planarize the surface of said BPSG film.

4. A method of fabricating a semiconductor integrated circuit device according to claim 2, further comprising a step of:

forming a field insulating film on the surface of said semiconductor substrate in said first and second portions, wherein said second conductive strip extends over said field insulating film.

5. A method of fabricating a semiconductor integrated circuit device according to claim 1, wherein said third conductive strip is integral with said fourth conductive strip.

6. A method of fabricating a semiconductor integrated circuit device according to claim 5, wherein said peripheral circuit includes a sense amplifier circuit.

7. A method of fabricating a semiconductor integrated circuit device having word lines, data lines, memory cells each connected to one of the word lines and one of the data lines and a peripheral circuit, and each of said memory cells including a first MISFET and a capacitor element and the peripheral circuit including a second MISFET, comprising the steps of:

preparing a semiconductor substrate having a main surface including a first portion for the memory cells and a second portion for the peripheral circuit;

forming a first conductive layer over said main surface of said semiconductor substrate and etching said first conductive layer so as to form a first conductive strip serving as a gate electrode of said first MISFET and one of said word lines in said first portion of said semiconductor substrate, and etching said first conductive layer so as to form a second conductive strip serving as a gate electrode of said second MISFET in said second portion of said semiconductor substrate;

forming a first semiconductor region and a second semiconductor region in said first portion of said semiconductor substrate, said first and second semiconductor regions being self-aligned with said first conductive strip;

forming a first insulating film over said first and second conductive strips in said first and second portions of said semiconductor substrate;

forming a second conductive layer over said first insulating film and etching said second conductive layer so as to form a third conductive strip serving as one of said data lines in said first portion and etching said second conductive layer so as to form a fourth conductive strip in said second portion;

forming a second insulating film over said third and fourth conductive strips;

forming a third conductive layer over said second insulating film and etching said third conductive layer so as to form a first electrode of said capacitor element in said first portion of said semiconductor substrate;

forming a fourth conductive layer over said first electrode and etching said fourth conductive layer so as to form a second electrode of said capacitor element in said first portion of said semiconductor substrate;

forming a third insulating film over a sixth conductive strip in said first portion and over said second insulating film in said second portion;

forming a fifth conductive layer over said third insulating film and etching said fifth conductive layer so as to form a seventh conductive strip in said second portion, wherein said third conductive strip is electrically connected to said first semiconductor region via said first contact hole, wherein said fourth conductive strip is electrically connected to said second conductive strip via said second contact hole, wherein a fifth conductive strip is electrically connected to said second semiconductor region, and wherein said seventh conductive strip is electrically connected to said fourth conductive strip.

8. A method of fabricating a semiconductor integrated circuit device according to claim 7, wherein said step of forming a third insulating film comprises the substeps of:

forming a silicon oxide film over said sixth conductive strip in said first portion and over said second insulating film in said second portion;

forming a BPSG film over said silicon oxide film; and annealing said BPSG film so as to planarize the surface of said BPSG film.

9. A method of fabricating a semiconductor integrated circuit device according to claim 8, wherein said third conductive strip is integral with said fourth conductive strip.

10. A method of fabricating a semiconductor integrated circuit device according to claim 9, wherein said peripheral circuit includes a sense amplifier circuit.

* * * * *